United States Patent
Rasouli et al.

(10) Patent No.: US 10,580,774 B2
(45) Date of Patent: *Mar. 3, 2020

(54) LAYOUT CONSTRUCTION FOR ADDRESSING ELECTROMIGRATION

(71) Applicant: QUALCOMM Incorporated, San Diego, CA (US)

(72) Inventors: Seid Hadi Rasouli, San Diego, CA (US); Animesh Datta, San Diego, CA (US); Ohsang Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,036

(22) Filed: Aug. 7, 2018

(65) Prior Publication Data

US 2018/0342515 A1 Nov. 29, 2018

Related U.S. Application Data

(63) Continuation of application No. 15/493,008, filed on Apr. 20, 2017, now Pat. No. 10,074,609, which is a
(Continued)

(51) Int. Cl.
*H01L 27/092* (2006.01)
*H01L 21/8238* (2006.01)
(Continued)

(52) U.S. Cl.
CPC .. *H01L 27/0921* (2013.01); *H01L 21/823871* (2013.01); *H01L 23/4824* (2013.01);
(Continued)

(58) Field of Classification Search
CPC ......... H01L 27/0921; H01L 21/823871; H01L 23/4824; H01L 23/535; H01L 27/0207;
(Continued)

(56) References Cited

U.S. PATENT DOCUMENTS 5,000,818 A 3/1991 Thomas et al.
5,237,184 A 8/1993 Yonemaru et al.
(Continued)

FOREIGN PATENT DOCUMENTS

CN 101345214 A 1/2009
CN 102624377 A 8/2012
(Continued)

OTHER PUBLICATIONS

International Search Report and Written Opinion—PCT/US2014/052020—ISA/EPO—dated Nov. 24, 2014.
(Continued)

*Primary Examiner* — Ismail A Muse
*Assistant Examiner* — Charles N Ausar-El
(74) *Attorney, Agent, or Firm* — Qualcomm Incorporated

(57) ABSTRACT

A first interconnect on an interconnect level connects a first subset of PMOS drains together of a CMOS device. A second interconnect on the interconnect level connects a second subset of the PMOS drains together. The second subset of the PMOS drains is different than the first subset of the PMOS drains. The first interconnect and the second interconnect are disconnected on the interconnect level. A third interconnect on the interconnect level connects a first subset of NMOS drains together of the CMOS device. A fourth interconnect on the interconnect level connects a second subset of the NMOS drains together. The second subset of the NMOS drains is different than the first subset of the NMOS drains. The third interconnect and the fourth interconnect are disconnected on the interconnect level. The first, second, third, and fourth interconnects are coupled together through at least one other interconnect level.

20 Claims, 17 Drawing Sheets

Related U.S. Application Data continuation of application No. 13/975,074, filed on Aug. 23, 2013, now Pat. No. 9,786,663.

(51) Int. Cl.
| | | |
|---|---|---|
| *H03K 17/16* | (2006.01) | |
| *H03K 17/687* | (2006.01) | |
| *H01L 23/482* | (2006.01) | |
| *H01L 27/02* | (2006.01) | |
| *H01L 23/535* | (2006.01) | |
| *H01L 23/522* | (2006.01) | |

(52) U.S. Cl.
CPC ........ *H01L 23/535* (2013.01); *H01L 27/0207* (2013.01); *H01L 27/092* (2013.01); *H03K 17/168* (2013.01); *H03K 17/6872* (2013.01); *H01L 23/522* (2013.01); *H01L 2924/0002* (2013.01)

(58) Field of Classification Search
CPC . H01L 27/092; H03K 17/168; H03K 17/6872
See application file for complete search history.

(56) References Cited

U.S. PATENT DOCUMENTS

| | | | |
|---|---|---|---|
| 5,444,276 | A | 8/1995 | Yokota et al. |
| 5,532,509 | A | 7/1996 | D'Addeo |
| 5,728,594 | A | 3/1998 | Efland et al. |
| 5,751,180 | A | 5/1998 | D'Addeo |
| 5,764,533 | A | 6/1998 | Dedood |
| 5,903,019 | A | 5/1999 | Watanabe |
| 5,977,573 | A | 11/1999 | Hiraga |
| 5,994,726 | A | 11/1999 | Ikeda et al. |
| 6,038,383 | A | 3/2000 | Young et al. |
| 6,271,548 | B1 | 8/2001 | Umemoto et al. |
| 6,281,529 | B1 | 8/2001 | Watanabe |
| 6,311,315 | B1 | 10/2001 | Tamaki |
| 6,372,586 | B1 | 4/2002 | Efland et al. |
| 6,448,168 | B1 | 9/2002 | Rao et al. |
| 6,710,371 | B2 | 3/2004 | Kitahara et al. |
| 6,980,462 | B1 | 12/2005 | Ramesh et al. |
| 7,471,101 | B2 | 12/2008 | Cranford et al. |
| 7,969,006 | B2 | 6/2011 | Lin et al. |
| 8,159,814 | B2 | 4/2012 | Wang et al. |
| 9,318,607 | B2 | 4/2016 | Seo et al. |
| 9,786,663 | B2 | 10/2017 | Rasouli et al. |
| 9,972,624 | B2 | 5/2018 | Rasouli et al. |
| 2001/0015464 | A1 | 8/2001 | Tamaki |
| 2001/0045571 | A1 | 11/2001 | Gandhi et al. |
| 2002/0014660 | A1 | 2/2002 | Noble et al. |
| 2004/0056329 | A1 | 3/2004 | Maiz et al. |
| 2004/0196705 | A1 | 10/2004 | Ishikura et al. |
| 2005/0144578 | A1 | 6/2005 | Decloedt |
| 2005/0212562 | A1 | 9/2005 | Gliese et al. |
| 2005/0250300 | A1 | 11/2005 | Fong |
| 2006/0289994 | A1 | 12/2006 | Greenberg et al. |
| 2007/0030741 | A1 | 2/2007 | Nii et al. |
| 2008/0086709 | A1 | 4/2008 | Rittman |
| 2009/0164964 | A1 | 6/2009 | Stamper et al. |
| 2009/0278207 | A1 | 11/2009 | Greenberg et al. |
| 2011/0241126 | A1 | 10/2011 | Herberholz |
| 2012/0176193 | A1 | 7/2012 | Chiang et al. |
| 2012/0221759 | A1 | 8/2012 | Yokouchi |
| 2012/0273849 | A1 | 11/2012 | Adamski |
| 2013/0055184 | A1 | 2/2013 | Shroff et al. |
| 2013/0069170 | A1 | 3/2013 | Blatchford |
| 2013/0208526 | A1 | 8/2013 | Chung |
| 2013/0308408 | A1 | 11/2013 | Yang |
| 2014/0252644 | A1 | 9/2014 | O'Brien et al. |
| 2015/0028495 | A1 | 1/2015 | Chen et al. |
| 2017/0221826 | A1 | 8/2017 | Rasouli et al. |
| 2018/0211957 | A1 | 7/2018 | Rasouli et al. |

FOREIGN PATENT DOCUMENTS

| | | |
|---|---|---|
| EP | 0714128 A2 | 5/1996 |
| EP | 2738806 A2 | 6/2014 |
| JP | S56112954 U | 8/1981 |
| JP | H06236923 A | 8/1994 |
| JP | H09129736 A | 5/1997 |
| JP | H1098108 A | 4/1998 |
| JP | 2002280456 A | 9/2002 |
| JP | 2005310923 | 11/2005 |
| JP | 2006100673 A | 4/2006 |
| JP | 2006515956 A | 6/2006 |
| JP | 2007073709 A | 3/2007 |
| JP | 2007141916 A | 6/2007 |
| JP | 2007214397 A | 8/2007 |
| JP | 2008227130 A | 9/2008 |
| JP | 2009177139 A | 8/2009 |
| JP | 2011524079 A | 8/2011 |
| JP | 2012182223 A | 9/2012 |
| WO | 2004034432 A2 | 4/2004 |
| WO | 2009137200 A1 | 11/2009 |
| WO | 2009139457 A1 | 11/2009 |
| WO | 2010016008 A1 | 2/2010 |

OTHER PUBLICATIONS

Knepper R.W., "Computing Intrinsic Transistor Capacitance," CMOS Design With Delay Constraints: Design for Performance, SC571, Jun. 30, 2017, pp. 1-22.

Knepper R.W., "CMOS Design with Delay Constraints: Design for Performance", SC571, Chapter4_b, 22 pages.

Lienig J., "Electromigration and Its Impact on Physical Design in Future Technologies," International Symposium on Physical Design (ISPD), Mar. 24-27, 2013, pp. 33-40.

MOSFET(1), MOSFET I-V Characteristics, Lecture 8, Spring, 2007, pp. 1-17.

Schwartz G.C., et al., "Handbook of Semiconductor Interconnection Technology," Second Edition, 2006, 511 pages.

Thiele M., et al., "Avoidance of Electromigration through Short Segment Lengths in the Layout of Digital Circuits Layout," Tagungsband Dresdner workshop circuit and system design (DASS 2012), Fraunhofer Verlag, May 2012, pp. 52-56.

LAYOUT CONSTRUCTION FOR ADDRESSING ELECTROMIGRATION

CROSS-REFERENCE TO RELATED APPLICATION(S)

This application is a continuation of U.S. application Ser. No. 15/493,008, entitled "LAYOUT CONSTRUCTION FOR ADDRESSING ELECTROMIGRATION" and filed on Apr. 20, 2017, which was a continuation of U.S. application Ser. No. 13/975,074, entitled "LAYOUT CONSTRUCTION FOR ADDRESSING ELECTROMIGRATION" and filed on Aug. 23, 2013, now U.S. Pat. No. 9,786,663, all of which are assigned to the assignee of the present application and are expressly incorporated by reference herein in their entirety.

BACKGROUND

Field

The present disclosure relates generally to a layout construction, and more particularly, to a layout construction for addressing electromigration (EM) in a complementary metal oxide semiconductor (CMOS) device.

Background

EM is the transport of material caused by the gradual movement of the ions in a conductor due to the momentum transfer between conducting electrons and diffusing metal atoms. EM can cause the eventual loss of connections or failure of an integrated circuit (IC), and therefore decreases the reliability of ICs. Accordingly, methods of laying out CMOS devices for addressing EM are needed. Further, CMOS devices with layout constructions for addressing EM are needed.

SUMMARY

In an aspect of the disclosure, a CMOS device including a plurality of p-type metal oxide semiconductor (PMOS) transistors each having a PMOS drain and a plurality of n-type metal oxide semiconductor (NMOS) transistors each having an NMOS drain is provided. The CMOS device includes a first interconnect on an interconnect level connecting a first subset of the PMOS drains together. The CMOS device further includes a second interconnect on the interconnect level connecting a second subset of the PMOS drains together. The second subset of the PMOS drains is different than the first subset of the PMOS drains. The first interconnect and the second interconnect are disconnected on the interconnect level. The CMOS device further includes a third interconnect on the interconnect level connecting a first subset of the NMOS drains together. The CMOS device further includes a fourth interconnect on the interconnect level connecting a second subset of the NMOS drains together. The second subset of the NMOS drains is different than the first subset of the NMOS drains. The third interconnect and the fourth interconnect are disconnected on the interconnect level. The first interconnect, the second interconnect, the third interconnect, and the fourth interconnect are coupled together through at least one other interconnect level.

In an aspect of the disclosure, a method of laying out a CMOS device including a plurality of PMOS transistors each having a PMOS drain and a plurality of NMOS transistors each having an NMOS drain is provided. A first subset of PMOS drains is interconnected with a first interconnect on an interconnect level. A second subset of PMOS drains is interconnected with a second interconnect on the interconnect level. The second subset of PMOS drains is disconnected from the first subset of PMOS drains on the interconnect level. A first subset of NMOS drains is interconnected with a third interconnect on the interconnect level. A second subset of NMOS drains is interconnected with a fourth interconnect on the interconnect level. The second subset of NMOS drains is disconnected from the first subset of NMOS drains on the interconnect level. The first interconnect, the second interconnect, the third interconnect, and the fourth interconnect are coupled together through at least one other interconnect level.

In an aspect of the disclosure, a method of operation of a CMOS device including a plurality of PMOS transistors each having a PMOS drain and a plurality of NMOS transistors each having an NMOS drain is provided. A first current flows from a first subset of PMOS drains interconnected with a first interconnect on an interconnect level. A second current flows from a second subset of PMOS drains interconnected with a second interconnect on the interconnect level. The second subset of PMOS drains is disconnected from the first subset of PMOS drains on the interconnect level. A third current flows to a first subset of NMOS drains interconnected with a third interconnect on the interconnect level. A fourth current flows to a second subset of NMOS drains interconnected with a fourth interconnect on the interconnect level. The second subset of NMOS drains is disconnected from the first subset of NMOS drains on the interconnect level. The first interconnect, the second interconnect, the third interconnect, and the fourth interconnect are coupled together through at least one other interconnect level. The first current and the second current flows through the at least one other interconnect level to an output of the CMOS device upon the CMOS device receiving a low input. The third current and the fourth current flows from the output of the CMOS device through the at least one other interconnect level upon the CMOS device receiving a high input.

In an aspect of the disclosure, a CMOS device including a plurality of PMOS transistors each having a PMOS drain and a plurality of NMOS transistors each having an NMOS drain is provided. The CMOS device includes a first interconnect on an interconnect level extending in a length direction to connect the PMOS drains together. The CMOS device further includes a second interconnect on the interconnect level extending in the length direction to connect the NMOS drains together. The CMOS device further includes a set of interconnects on at least one additional interconnect level coupling the first interconnect and the second interconnect together. The CMOS device further includes a third interconnect on the interconnect level extending perpendicular to the length direction and offset from the set of interconnects to connect the first interconnect and the second interconnect together.

In an aspect of the disclosure, a method of laying out a CMOS device including a plurality of PMOS transistors each having a PMOS drain and a plurality of NMOS transistors each having an NMOS drain is provided. The PMOS drains are interconnected with a first interconnect on an interconnect level extending in a length direction. The NMOS drains are interconnected with a second interconnect on the interconnect level extending in the length direction. The first interconnect and the second interconnect are interconnected with a set of interconnects on at least one additional interconnect level. The first interconnect and the second interconnect are interconnected with a third interconnect on the interconnect level extending perpendicular to the length direction and offset from the set of interconnects.

In an aspect of the disclosure, a method of operation of a CMOS device including a plurality of PMOS transistors each having a PMOS drain and a plurality of NMOS transistors each having an NMOS drain is provided. A first current flows through a first interconnect that extends in a length direction and interconnects the PMOS drains on an interconnect level. A second current flows through a second interconnect that extends in the length direction and interconnects the NMOS drains on the interconnect level. A third current flows through a set of interconnects that interconnects the first interconnect and the second interconnect on at least one additional interconnect level. A fourth current flows through a third interconnect that extends perpendicular to the length direction, is offset from the set of interconnects, and interconnects the first interconnect and the second interconnect on the interconnect level. A fifth current flows through a fourth interconnect that interconnects the first interconnect and the second interconnect on the interconnect level, extends perpendicular to the length direction, and is offset from the set of interconnects. The third interconnect and the fourth interconnect are on opposite sides of the set of interconnects. Upon the CMOS device receiving a low input, the first current flows through the first interconnect to a first subset of the set of interconnects, the second current flows from the third interconnect and the fourth interconnect through the second interconnect to a second subset of the set of interconnects, the third current flows from the first interconnect and the second interconnect through the set of interconnects, the fourth current flows from the first interconnect through the third interconnect to the second interconnect, and the fifth current flows from the first interconnect through the fourth interconnect to the second interconnect. Upon the CMOS device receiving a high input, the first current flows from the first subset of the set of interconnects through the first interconnect to the third interconnect and the fourth interconnect, the second current flows from the second subset of the set of interconnects through the second interconnect, the third current flows from the set of interconnects to the first interconnect and the second interconnect, the fourth current flows from the first interconnect through the third interconnect to the second interconnect, and the fifth current flows from the first interconnect through the fourth interconnect to the second interconnect.

In an aspect of the disclosure, a CMOS device including a plurality of PMOS transistors each having a PMOS drain and a plurality of NMOS transistors each having an NMOS drain is provided. The CMOS device includes a first interconnect on an interconnect level connecting a first subset of the PMOS drains together. The CMOS device further includes a second interconnect on the interconnect level connecting a second subset of the PMOS drains together. The second subset of the PMOS drains is different than the first subset of the PMOS drains. The first interconnect and the second interconnect are disconnected on the interconnect level. The CMOS device further includes a third interconnect on the interconnect level connecting a first subset of the NMOS drains together. The CMOS device further includes a fourth interconnect on the interconnect level connecting a second subset of the NMOS drains together. The second subset of the NMOS drains is different than the first subset of the NMOS drains. The third interconnect and the fourth interconnect are disconnected on the interconnect level. The first interconnect, the second interconnect, the third interconnect, and the fourth interconnect are coupled together through at least one other interconnect level. The CMOS device further includes a fifth interconnect on a second interconnect level. The fifth interconnect couples the first interconnect and the second interconnect together. The CMOS device further includes a sixth interconnect on the second interconnect level. The sixth interconnect couples the third interconnect and the fourth interconnect together. The CMOS device further includes a seventh interconnect on a third interconnect level. The seventh interconnect couples the fifth interconnect and the sixth interconnect together. The CMOS device further includes an eighth interconnect on the interconnect level connecting the first interconnect and the third interconnect together. The CMOS device further includes a ninth interconnect on the interconnect level connecting the second interconnect and the fourth interconnect together.

In an aspect of the disclosure, a method of laying out a CMOS device including a plurality of PMOS transistors each having a PMOS drain and a plurality of NMOS transistors each having an NMOS drain is provided. A first subset of PMOS drains is interconnected with a first interconnect on an interconnect level. A second subset of PMOS drains is interconnected with a second interconnect on the interconnect level. The second subset of PMOS drains is disconnected from the first subset of PMOS drains on the interconnect level. A first subset of NMOS drains is interconnected with a third interconnect on the interconnect level. A second subset of NMOS drains is interconnected with a fourth interconnect on the interconnect level. The second subset of NMOS drains is disconnected from the first subset of NMOS drains on the interconnect level. The first interconnect and the second interconnect are interconnected with a fifth interconnect on a second interconnect level. The third interconnect and the fourth interconnect are interconnected with a sixth interconnect on the second interconnect level. The fifth interconnect and the sixth interconnect are interconnected with a seventh interconnect on a third interconnect level. The first interconnect and the third interconnect are interconnected with an eight interconnect on the interconnect level. The second interconnect and the fourth interconnect are interconnected with a ninth interconnect on the interconnect level.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
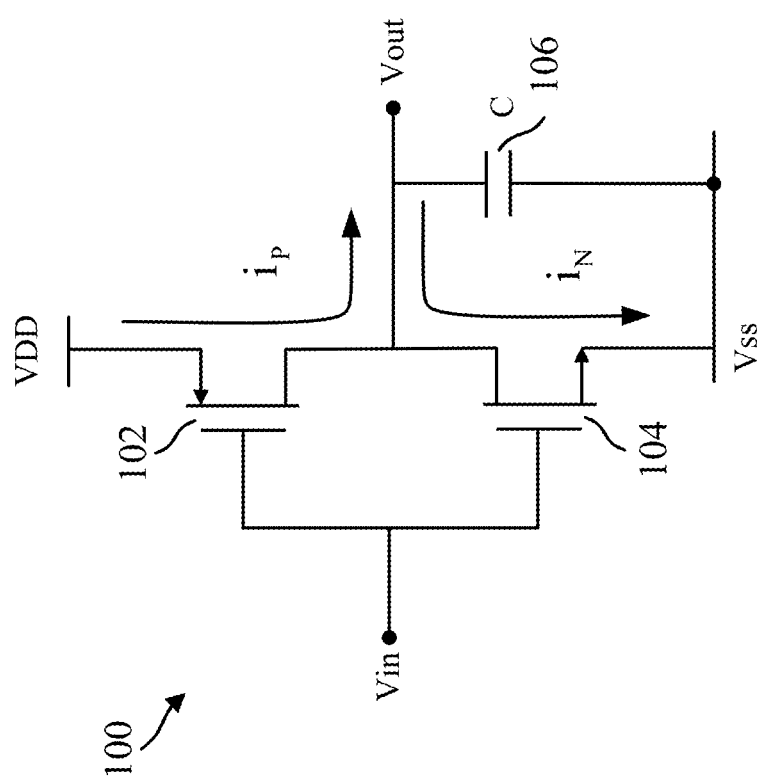
FIG. 1 is a diagram illustrating a CMOS inverter.

FIG. 1 is a diagram 100 illustrating a CMOS inverter. The CMOS inverter includes a PMOS transistor 102 and an NMOS transistor 104. A source of the PMOS transistor 102 is connected to $V_{DD}$. A gate of the PMOS transistor is connected to $V_{in}$ and to a gate of the NMOS transistor 104. A drain of the PMOS transistor is connected to $V_{out}$ and to a drain of the NMOS transistor 104. A source of the NMOS transistor 104 is connected to $V_{SS}$. The gate of the NMOS transistor 104 is connected to $V_{in}$ and to the gate of the PMOS transistor 102. The drain of the NMOS transistor 104 is connected to $V_{out}$ and to the drain of the PMOS transistor 102. The PMOS transistor 102 may include a plurality of PMOS transistors in parallel and the NMOS transistor 104 may include a plurality of NMOS transistors in parallel. The PMOS and NMOS transistors may be connected together as described supra through a set of interconnects. When the input $V_{in}$ is a clock, the CMOS inverter may be referred to as a clock cell. The clock cell may be operated at the operational clock frequency f which is the frequency of the clock input at $V_{in}$.

An average of the current $i_P$ when $V_{in}$ transitions from high to low, the PMOS transistor 102 is turned on, and the NMOS transistor 104 is turned off and an average of the current $i_N$ when $V_{in}$ transitions from low to high, the PMOS transistor 102 is turned off, and the NMOS transistor 104 is turned on may be referred to as $I_{ave}$. The average current $I_{ave} \propto C(V_{DD}-V_{SS})f_{max}$, where C is a load capacitance C 106 at $V_{out}$ and $f_{max}$ is the maximum operational clock frequency of the clock cell. In order to maintain EM compliance, the average current $I_{avg}$ through the interconnects should be less than $I_{max}$. The value $I_{max}$ is the maximum average direct current (DC) allowed for a metal interconnect, via, or contact to maintain EM compliance. The value $I_{max}$ depends on the width and length of the interconnects and the transistor technology (e.g., 28 nm process technology, 20 nm system-on-chip (SoC) process technology, or 16 nm fin field effect transistor (FinFET) process technology). The value $I_{max}$ reduces with scaling (i.e., smaller process technology) as a result of the change in the transistor technology and shorter interconnect width. On the other hand, the value $I_{ave}$ increases with scaling from the 20SoC process technology to the 16 nm FinFET process technology due to a higher maximum operational clock frequency $f_{max}$ and a higher input capacitance in the FinFET. The clock cell is utilized in series with other clocks cells of the same process technology. As such, the higher input capacitance in the FinFET results in a higher load capacitance C.

EM may be reduced by increasing an interconnect width or by including parallel interconnects that effectively increase an interconnect width, but such methods increase the input capacitance of the clock cell. As discussed supra, EM is the transport of material caused by the gradual movement of the ions in a conductor due to the momentum transfer between conducting electrons and diffusing metal atoms. The force from the exchange of momentum is caused by what is called electron wind. EM is counteracted by a mechanical stress buildup (also called back stress) that causes an atom back flow process. The back stress may be increased by shortening an interconnect length. In a first set of exemplary methods and apparatuses, EM is reduced by increasing the value $I_{max}$ through decreasing the interconnect length within the clock cell. In one example, the value $I_{max}$ may be increased by 2.4-3×, which allows for a 2.4-3× higher $f_{max}$ or a capability to drive 2.4-3× higher load without EM violation. In a second set of exemplary methods and apparatuses, EM is reduced through an interconnect layout that provides for current flow in opposite directions within particular interconnects during operation. For the FinFET process technology where the input capacitance and the $f_{max}$ are higher than for the 20SoC process technology, the increase in the value $I_{max}$ can allow the clock cells to be EM compliant.

Figure 2:
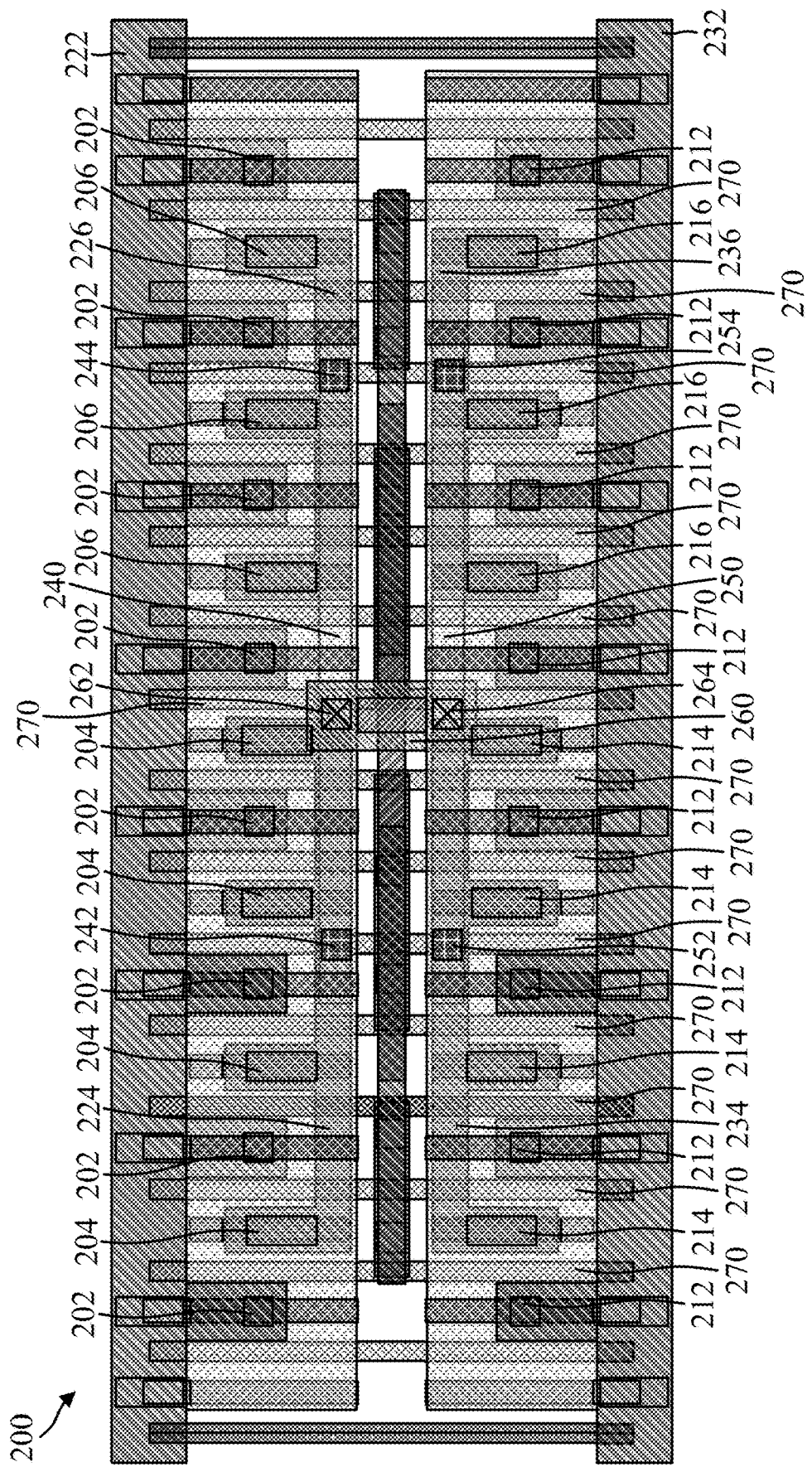
FIG. 2 is a first diagram for illustrating an exemplary layout of a CMOS inverter.

FIG. 2 is a first diagram 200 for illustrating an exemplary layout of a CMOS inverter. As shown in FIG. 2, the CMOS inverter includes a plurality of PMOS and NMOS transistors. The sources 202 of the PMOS transistors are connected together through an interconnect 222 on a first metal layer (also referred to as a first interconnect level). The drains 204 of a first subset of PMOS transistors are connected together through an interconnect 224 on the first metal layer. The drains 206 of a second subset of PMOS transistors are connected together through an interconnect 226 on the first metal layer. The interconnect 224 and the interconnect 226 are disconnected on the first metal layer. The sources 212 of the NMOS transistors are connected together through an interconnect 232 on the first metal layer. The drains 214 of a first subset of NMOS transistors are connected together through an interconnect 234 on the first metal layer. The drains 216 of a second subset of NMOS transistors are connected together through an interconnect 236 on the first metal layer. The interconnect 234 and the interconnect 236 are disconnected on the first metal layer.

The interconnects 224, 226 are connected through an interconnect 240 on a second metal layer (also referred to as a second interconnect level) through vias 242, 244. The interconnects 234, 236 are connected through an interconnect 250 on the second metal layer through vias 252, 254. The interconnects 240, 250 are connected through an interconnect 260 on a third metal layer (also referred to as a third interconnect level) through vias 262, 264. The gates 270 of the PMOS and NMOS transistors are all connected together. An input of the CMOS inverter is connected to the gates 270. An output of the CMOS inverter is connected to the interconnect 260.

Figure 3:
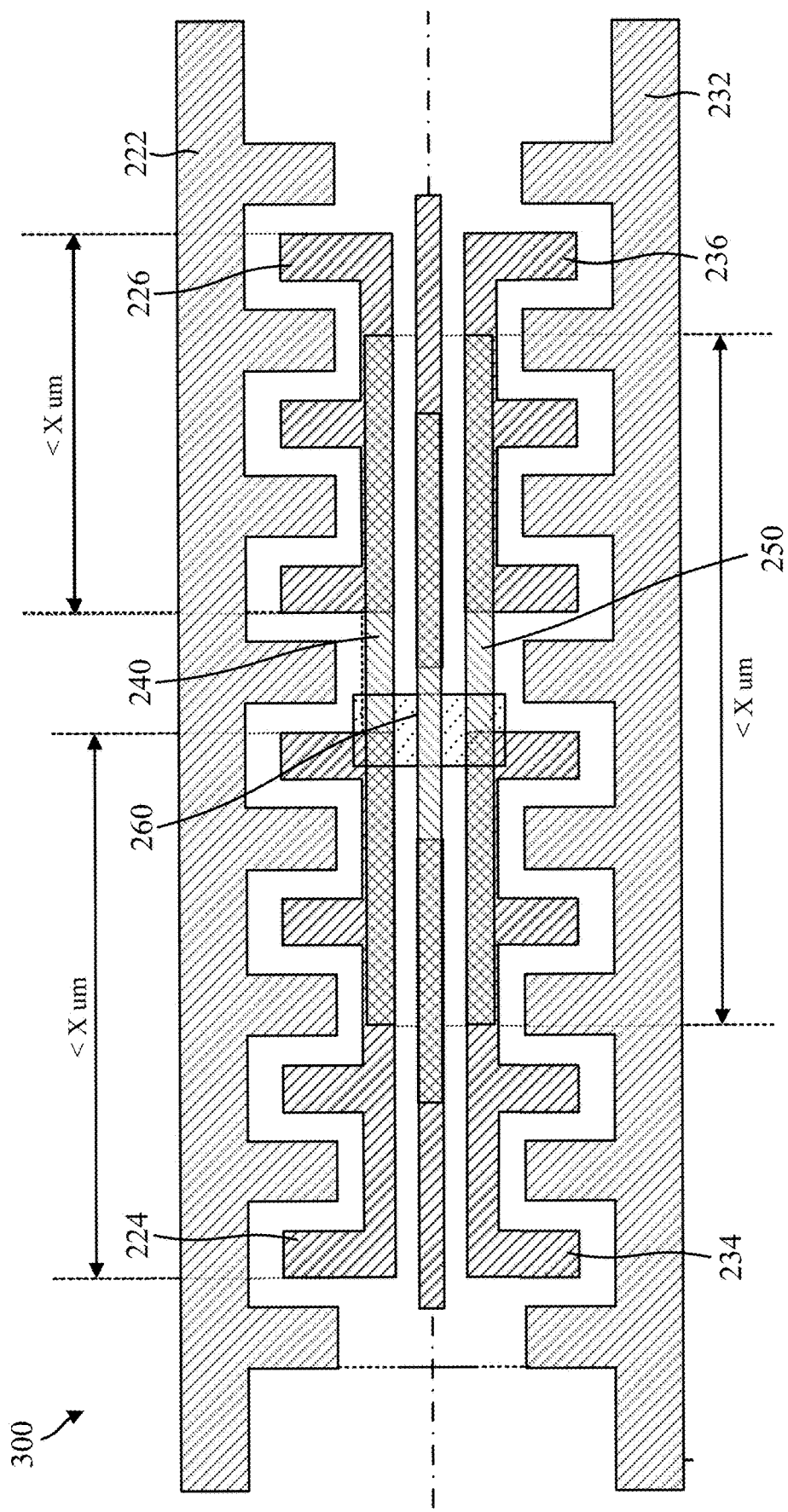
FIG. 3 is a second diagram for illustrating an exemplary layout of a CMOS inverter.

FIG. 3 is a second diagram 300 for illustrating an exemplary layout of a CMOS inverter. As shown in FIG. 3, the interconnect 224 on the first metal layer and the interconnect 226 on the first metal layer are disconnected on the first metal layer. The interconnects 224, 226 may be disconnected such that a length of each of the interconnects 224, 226 is less than x μm. Furthermore, as shown in FIG. 3, the interconnect 234 on the first metal layer and the interconnect 236 on the first metal layer are disconnected on the first metal layer. The interconnects 234, 236 may be disconnected such that a length of each of the interconnects 234, 236 is less than x μm. The interconnects 224, 226 are connected through the interconnect 240. The interconnect 240 may have a length less than x μm. The interconnects 234, 236 are connected through the interconnect 250. The interconnect 250 may have a length less than x μm. The interconnects 240, 250 are connected through the interconnect 260, which is the output of the CMOS inverter. In one configuration, x=2 and each of the interconnects 224, 226, 234, 236, 240, 250 is less than 2 μm. By disconnecting the interconnects 224, 226 on the first metal layer and connecting the interconnects 224, 226 through the interconnect 240 on the second metal layer and by disconnecting the interconnects 234, 236 on the first metal layer and connecting the interconnects 234, 236 through the interconnect 250 on the second metal layer, where the interconnects 240, 250 are connected through the interconnect 260 on the third metal layer, a length of each of the interconnects 224, 226, 234, 236 may be reduced, thereby increasing the back stress on each of the interconnects 224, 226, 234, 236. By increasing the back stress on each of the interconnects 224, 226, 234, 236, EM in each of the interconnects 224, 226, 234, 236 is reduced and the value $I_{max}$ is increased.

Figure 4:
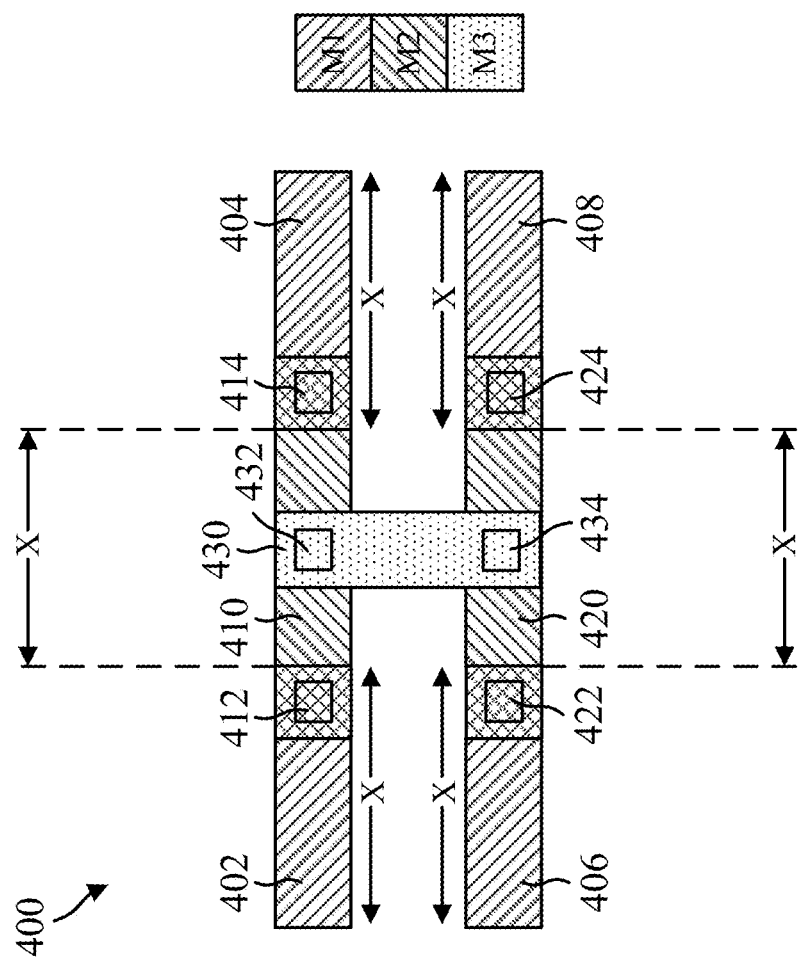
FIG. 4 is a first diagram for illustrating a first set of exemplary layouts of a CMOS device.

FIG. 4 is a first diagram 400 for illustrating a first set of exemplary layouts of a CMOS device. The CMOS device may include a plurality of PMOS and NMOS transistors and may be an inverter. A first interconnect 402 on a first metal layer M1 (i.e., a first interconnect level) may connect a first subset of the PMOS drains together. A second interconnect 404 on the first metal layer M1 may connect a second subset of the PMOS drains together. The second subset of the PMOS drains is different than the first subset of the PMOS drains. The first interconnect 402 and the second interconnect 404 are disconnected on the first metal layer M1. As such, the first interconnect 402 and the second interconnect 404 are not directly connected together on the first metal layer M1. A third interconnect 406 on the first metal layer M1 connects a first subset of the NMOS drains together. A fourth interconnect 408 on the first metal layer M1 connects a second subset of the NMOS drains together. The second subset of the NMOS drains is different than the first subset of the NMOS drains. The third interconnect 406 and the fourth interconnect 408 are disconnected on the first metal layer M1. As such, the third interconnect 406 and the fourth interconnect 408 are not directly connected together on the first metal layer M1. However, as shown in FIG. 4, the first interconnect 402, the second interconnect 404, the third interconnect 406, and the fourth interconnect 408 are coupled together through at least one other interconnect level. The first interconnect 402, the second interconnect 404, the third interconnect 406, and the fourth interconnect 408 may each be less than x μm in length. In one configuration, x=2 and the first interconnect 402, the second interconnect 404, the third interconnect 406, and the fourth interconnect 408 are each less than 2 μm in length.

As shown in FIG. 4, a fifth interconnect 410 on a second metal layer M2 (i.e., a second interconnect level) couples the first interconnect 402 and the second interconnect 404 together through the vias 412, 414. A sixth interconnect 420 on the second metal layer M2 couples the third interconnect 406 and the fourth interconnect 408 together through the vias 422, 424. The fifth interconnect 410 and the sixth interconnect 420 may each be less than x μm in length. In one configuration, x=2 and the fifth interconnect 410 and the sixth interconnect 420 are each less than 2 μm in length. A seventh interconnect 430 on a third metal layer M3 couples the fifth interconnect 410 and the sixth interconnect 420 together through the vias 432, 434. An output of the device is connected to the seventh interconnect 430.

Figure 5:
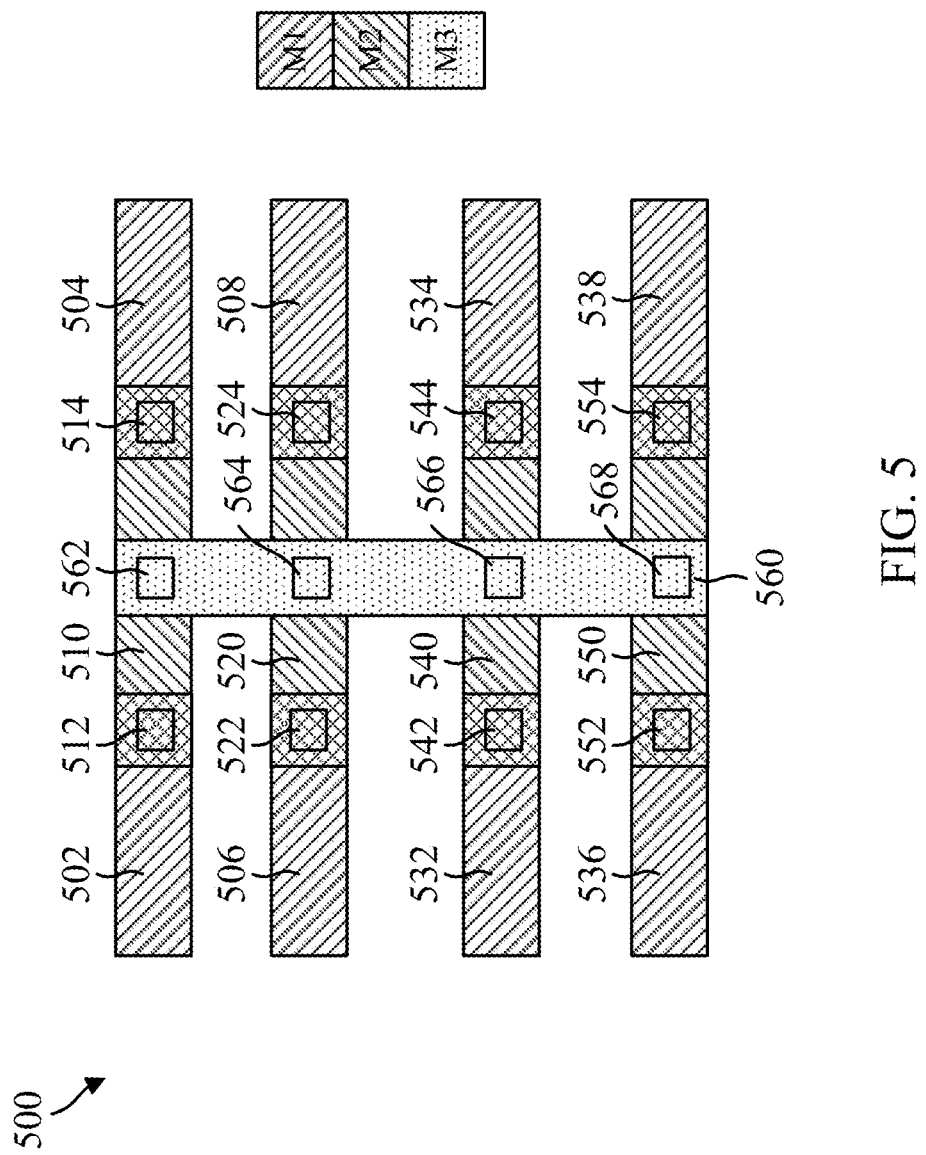
FIG. 5 is a second diagram for illustrating a first set of exemplary layouts of a CMOS device.

FIG. 5 is a second diagram 500 for illustrating a first set of exemplary layouts of a CMOS device. The CMOS device may include a plurality of PMOS and NMOS transistors and may be an inverter. In order to increase the number of PMOS and NMOS transistors in the CMOS inverter without increasing interconnect lengths beyond a threshold (e.g., 2 μm), a CMOS inverter may utilize multiple devices of FIG. 4 in parallel. A first interconnect 502 on a first metal layer M1 may connect a first subset of the PMOS drains together. A second interconnect 504 on the first metal layer M1 may connect a second subset of the PMOS drains together. The second subset of the PMOS drains is different than the first subset of the PMOS drains. The first interconnect 502 and the second interconnect 504 are disconnected on the first metal layer M1. As such, the first interconnect 502 and the second interconnect 504 are not directly connected together on the first metal layer M1. A third interconnect 506 on the first metal layer M1 may connect a first subset of the NMOS drains together. A fourth interconnect 508 on the first metal layer M1 may connect a second subset of the NMOS drains together. The second subset of the NMOS drains is different than the first subset of the NMOS drains. The third interconnect 506 and the fourth interconnect 508 are disconnected on the first metal layer M1. As such, the third interconnect 506 and the fourth interconnect 508 are not directly connected together on the first metal layer M1. A fifth interconnect 510 on a second metal layer M2 couples the first interconnect 502 and the second interconnect 504 together through the vias 512, 514. A sixth interconnect 520 on the second metal layer M2 couples the third interconnect 506 and the fourth interconnect 508 together through the vias 522, 524.

A seventh interconnect 532 on the first metal layer M1 connects a third subset of the PMOS drains together. An eighth interconnect 534 on the first metal layer M1 connects a fourth subset of the PMOS drains together. The fourth subset of the PMOS drains is different than the third subset of the PMOS drains. The seventh interconnect 532 and the eighth interconnect 534 are disconnected on the first metal layer M1. As such, the seventh interconnect 532 and the eighth interconnect 534 are not directly connected together on the first metal layer M1. A ninth interconnect 536 on the first metal layer M1 connects a third subset of the NMOS drains together. A tenth interconnect 538 on the first metal layer M1 connects a fourth subset of the NMOS drains together. The fourth subset of the NMOS drains is different than the third subset of the NMOS drains. The ninth interconnect 536 and the tenth interconnect 538 are disconnected on the first metal layer M1. As such, the ninth interconnect 536 and the tenth interconnect 538 are not directly connected together on the first metal layer M1. An eleventh interconnect 540 on the second metal layer M2 couples the seventh interconnect 532 and the eighth interconnect 534 together through the vias 542, 544. A twelfth interconnect 550 on the second metal layer M2 couples the ninth interconnect 536 and the tenth interconnect 538 together through the vias 552, 554. A thirteenth interconnect 560 on a third metal layer M3 couples the fifth interconnect 510, the sixth interconnect 520, the eleventh interconnect 540, and the twelfth interconnect 550 together through the vias 562, 564, 566, 568.

As shown in FIG. 5, a first set of interconnects 502, 504, 532, 534 on the first metal layer M1 may connect different subsets of the PMOS drains together. Each interconnect in the first set of interconnects 502, 504, 532, 534 is disconnected from other interconnects in the first set of interconnects 502, 504, 532, 534 on the first metal layer M1. A second set of interconnects 506, 508, 536, 538 on the first metal layer M1 connect different subsets of the NMOS drains together. Each interconnect in the second set of interconnects 506, 508, 536, 538 is disconnected from other interconnects in the second set of interconnects 506, 508, 536, 538 on the first metal layer M1. A first subset 510 of a third set of interconnects 510, 540 couple a different adjacent pair of interconnects in a first subset 502, 504 of the first set of interconnects 502, 504, 532, 534 together. A second subset 540 of the third set of interconnects 510, 540 couple a different adjacent pair of interconnects in a second subset 532, 534 of the first set of interconnects 502, 504, 532, 534 together. A first subset 520 of a fourth set of interconnects 520, 550 couple a different adjacent pair of interconnects in a first subset 506, 508 of the second set of interconnects 506, 508, 536, 538 together. A second subset 550 of the fourth set of interconnects 520, 550 couple a different adjacent pair of interconnects in a second subset 536, 538 of the second set of interconnects 506, 508, 536, 538 together. A fifth interconnect 560 on a third metal layer M3 couples each of the interconnects in the third set of interconnects 510, 540 to each of the interconnects in the fourth set of interconnects 520, 550.

Each interconnect in the first set of interconnects 502, 504, 532, 534 and the second set of interconnects 506, 508, 536, 538 may be less than x μm in length. Furthermore, each interconnect in the third set of interconnects 510, 540 and the fourth set of interconnects 520, 550 may be less than x μm in length. In one configuration, x=2.

Figure 6:
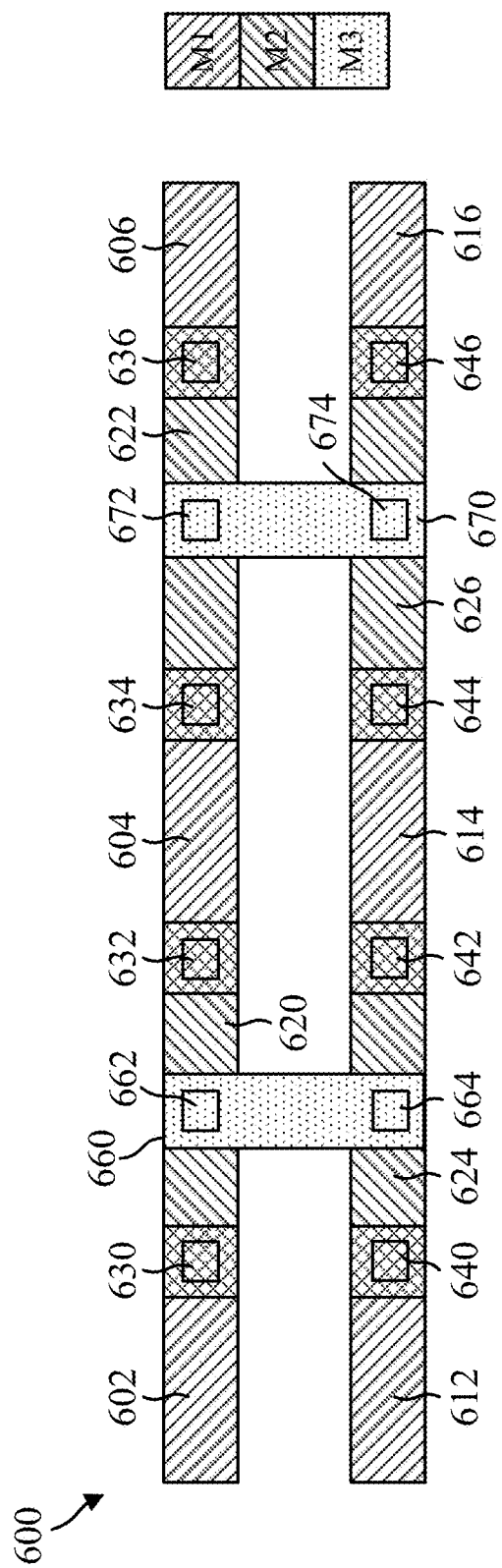
FIG. 6 is a third diagram for illustrating a first set of exemplary layouts of a CMOS device.

FIG. 6 is a third diagram 600 for illustrating a first set of exemplary layouts of a CMOS device. The CMOS device may include a plurality of PMOS and NMOS transistors and may be an inverter. In order to increase the number of PMOS and NMOS transistors in the CMOS inverter without increasing interconnect lengths beyond a threshold (e.g., 2 μm), a CMOS inverter may utilize multiple devices of FIG. 4 in series. A first interconnect 602 on a first metal layer M1 may connect a first subset of the PMOS drains together. A second interconnect 604 on the first metal layer M1 may connect a second subset of the PMOS drains together. The second subset of the PMOS drains is different than the first subset of the PMOS drains. The first interconnect 602 and the second interconnect 604 are disconnected on the first metal layer M1. As such, the first interconnect 602 and the second interconnect 604 are not directly connected together on the first metal layer M1. A third interconnect 612 on the first metal layer M1 may connect a first subset of the NMOS drains together. A fourth interconnect 614 on the first metal layer M1 may connect a second subset of the NMOS drains together. The second subset of the NMOS drains is different than the first subset of the NMOS drains. The third interconnect 612 and the fourth interconnect 614 are disconnected on the first metal layer M1. As such, the third interconnect 612 and the fourth interconnect 614 are not directly connected together on the first metal layer M1.

A fifth interconnect 606 on a first metal layer M1 may connect a third subset of the PMOS drains together. The third subset of the PMOS drains is different than the first and second subsets of the PMOS drains. The third interconnect 606 and the second interconnect 604 are disconnected on the first metal layer M1. As such, the third interconnect 606 and the second interconnect 604 are not directly connected together on the first metal layer M1. A sixth interconnect 616 on the first metal layer M1 may connect a third subset of the NMOS drains together. The third subset of the NMOS drains is different than the first and second subsets of the NMOS drains. The sixth interconnect 616 and the fourth interconnect 614 are disconnected on the first metal layer M1. As such, the sixth interconnect 616 and the fourth interconnect 614 are not directly connected together on the first metal layer M1.

As shown in FIG. 6, a first set of interconnects 602, 604, 606 on the first metal layer M1 may connect different subsets of the PMOS drains together. Each interconnect in the first set of interconnects 602, 604, 606 is disconnected from other interconnects in the first set of interconnects 602, 604, 606 on the first metal layer M1. A second set of interconnects 612, 614, 616 on the first metal layer M1 connect different subsets of the NMOS drains together. Each interconnect in the second set of interconnects 612, 614, 616 is disconnected from other interconnects in the second set of interconnects 612, 614, 616 on the first metal layer M1. A third set of interconnects 620, 622 on the second metal layer M2 couple different adjacent pairs of interconnects in the first set of interconnects 602, 604, 606 together through the vias 630, 632, 634, and 636. A fourth set of interconnects 624, 626 on the second metal layer M2 couple different adjacent pairs of interconnects in the second set of interconnects 612, 614, 616 together through the vias 640, 642, 644, and 646. A fifth set of interconnects 660, 670 on the third metal layer M3 couple different adjacent pairs of interconnects including interconnects from the third set of interconnects 620, 622 through the vias 662 and 672, and interconnects from the fourth set of interconnects 624, 626 through the vias 664 and 674. Each interconnect in the fifth set of interconnects 660, 670 is coupled together.

Each interconnect in the first set of interconnects and the second set of interconnects may be less than x μm in length. Furthermore, each interconnect in the third set of interconnects and the fourth set of interconnects may be less than x μm in length. In one configuration, x=2.

Figure 7A:
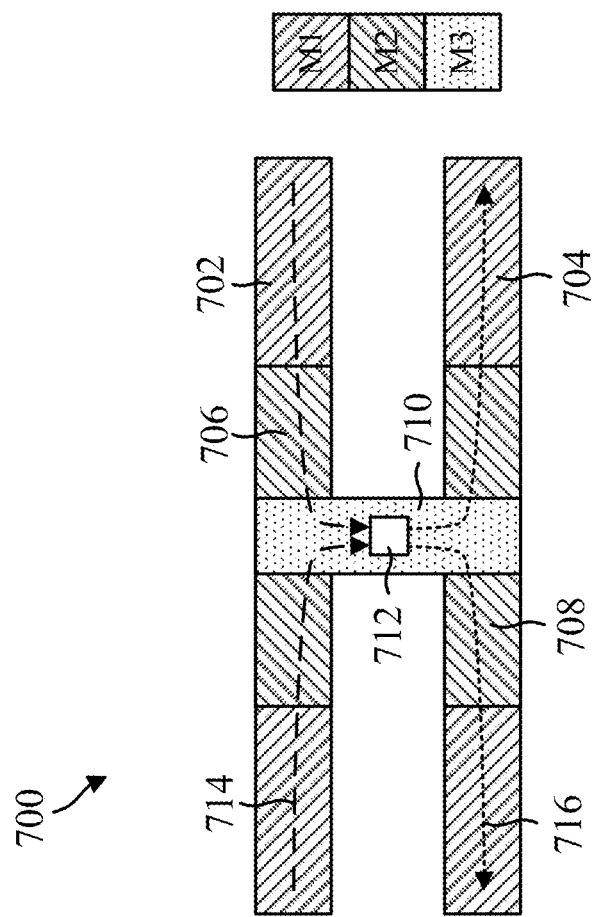
FIG. 7A is a diagram for illustrating current flow within interconnects of a CMOS device.
Figure 7B:
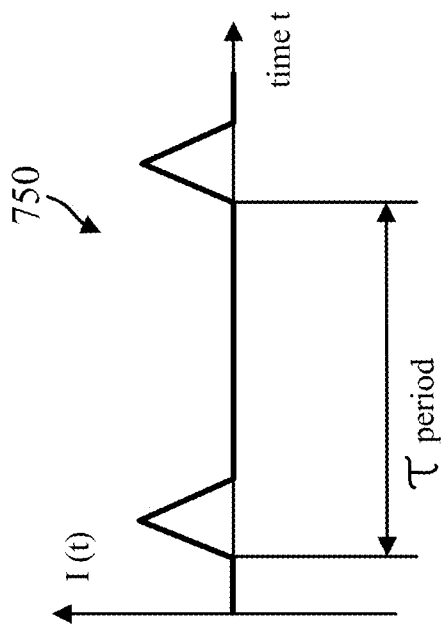
FIG. 7B is a graph of current flow within the interconnects of the diagram of FIG. 7A.

FIG. 7A is a diagram 700 for illustrating current flow within interconnects of a CMOS device. FIG. 7B is a graph 750 of current flow within the interconnects of the diagram of FIG. 7A. In FIG. 7B, the period r is the time period between the NMOS transistors being turned on and subsequently being turned on again after being turned off, or the time period between the PMOS transistors being turned on and subsequently being turned on again after being turned off. Assume that the CMOS device is an inverter and that the interconnect 702 on a first metal layer M1 connects a plurality of PMOS drains together and the interconnect 704 on the first metal layer M1 connects a plurality of NMOS drains together. The interconnect 706 on a second metal layer M2 is connected to the interconnect 702. The interconnect 708 on the second metal layer M2 is connected to the interconnect 704. The interconnect 710 on a third metal layer M3 is connected to the interconnects 706, 708. An output 712 of the CMOS device is located on the interconnect 710. When the NMOS transistors are turned off and the PMOS transistors are turned on, current 714 flows from the sources of the PMOS transistors to the drains of the PMOS transistors and through the interconnects 702, 706, 710 to the output 712. When the PMOS transistors are turned off and the NMOS transistors are turned on, current 716 flows from the output 712 through the interconnects 710, 708, 704 to the drains of the NMOS transistors and then to the sources of the NMOS transistors. The currents 714, 716 through the interconnects 702, 704, 706, 708 are unidirectional as shown in FIG. 7B.

Figure 8:
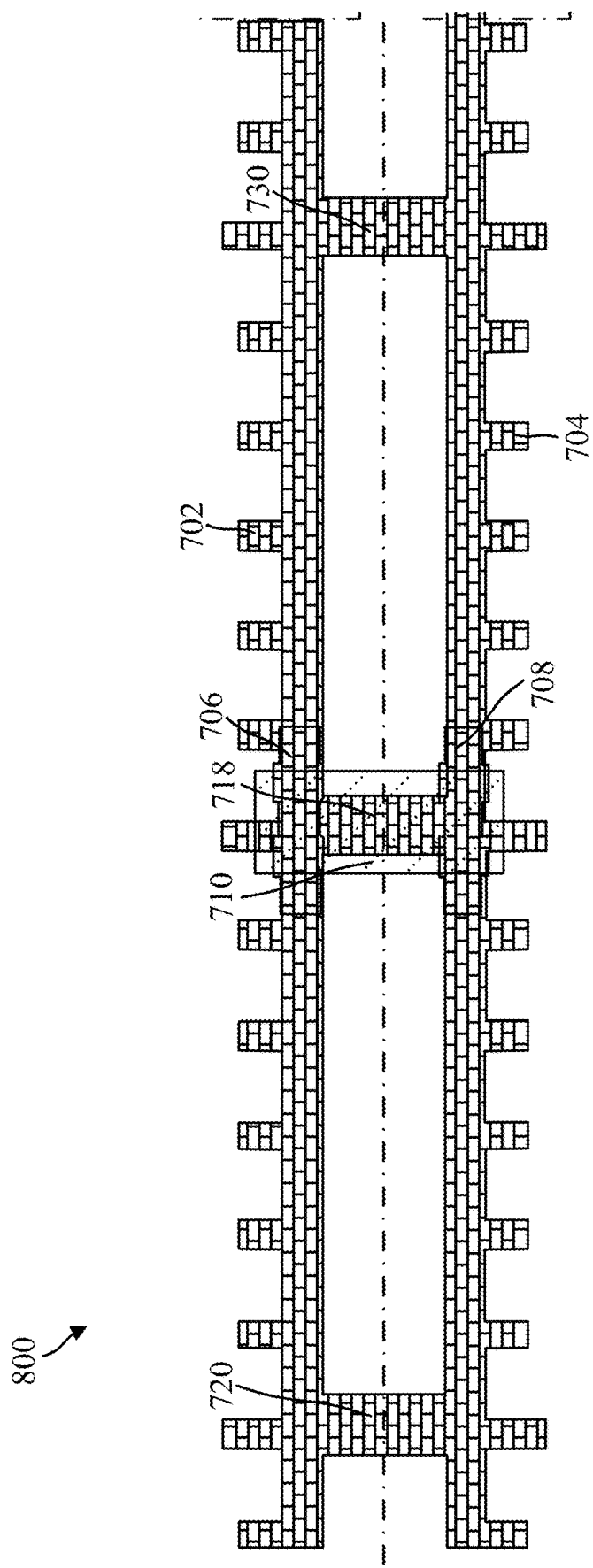
FIG. 8 is a first diagram for illustrating a second set of exemplary layouts of a CMOS device.

FIG. 8 is a first diagram 800 for illustrating a second set of exemplary layouts of a CMOS device. Assume the interconnect 702 on a first metal layer M1 connects a plurality of PMOS drains together and the interconnect 704 on the first metal layer M1 connects a plurality of NMOS drains together. The interconnect 706 on a second metal layer M2 is connected to the interconnect 702. The interconnect 708 on the second metal layer M2 is connected to the interconnect 704. The interconnect 710 on a third metal layer M3 is connected to the interconnects 706, 708. In an exemplary layout, an interconnect 720 on the first metal layer M1 connects the interconnects 702, 704 together on one side of the interconnect 710, and the interconnect 730 on the first metal layer M1 connects the interconnects 702, 704 together on the other side of the interconnect 710. The diagram 800 shows an interconnect 718 connecting the interconnects 702, 704 together beneath the interconnect 710. However, the layout may not include the interconnect 718.

Figure 9B:
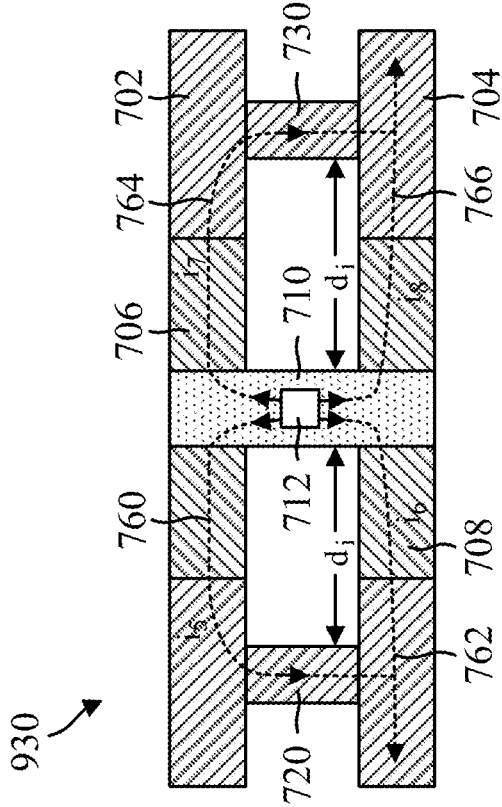
FIG. 9B is a second diagram for illustrating current flow within interconnects of an exemplary CMOS device.
Figure 9A:
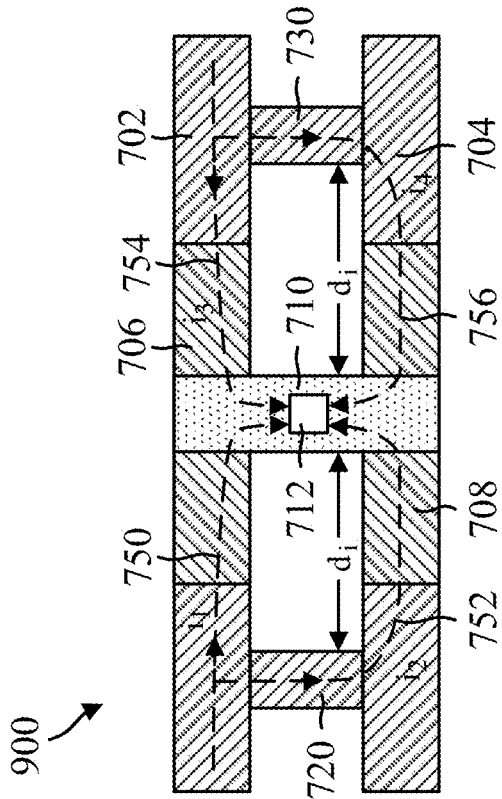
FIG. 9A is a first diagram for illustrating current flow within interconnects of an exemplary CMOS device.
Figure 9C:
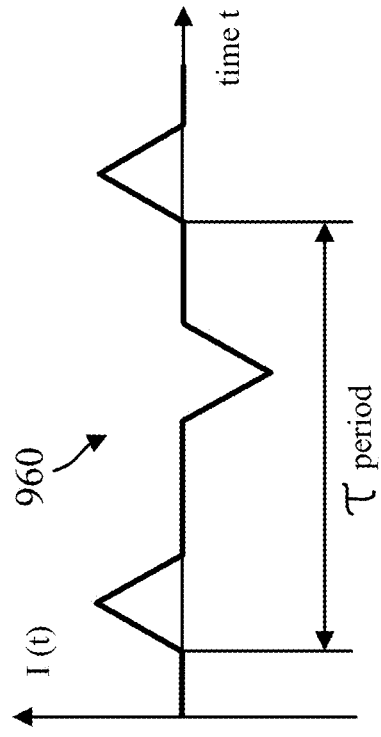
FIG. 9C is a graph of current flow within the interconnects of the diagrams of FIG. 9A and FIG. 9B.

FIG. 9A is a first diagram 900 for illustrating current flow within interconnects of an exemplary CMOS device. FIG. 9B is a second diagram 930 for illustrating current flow within interconnects of an exemplary CMOS device. FIG. 9C is a graph 960 of current flow within the interconnects of the diagrams of FIG. 9A and FIG. 9B. In FIG. 9C, the period r is the time period between the NMOS transistors being turned on and subsequently being turned on again after being turned off, or the time period between the PMOS transistors being turned on and subsequently being turned on again after being turned off. Assume the interconnect 702 on a first metal layer M1 connects a plurality of PMOS drains together and the interconnect 704 on the first metal layer M1 connects a plurality of NMOS drains together. The interconnect 706 on a second metal layer M2 is connected to the interconnect 702. The interconnect 708 on the second metal layer M2 is connected to the interconnect 704. The interconnect 710 on a third metal layer M3 is connected to the interconnects 706, 708. An output 712 of the CMOS device is located on the interconnect 710. When the NMOS transistors are turned off and the PMOS transistors are turned on, currents 750, 754 flow through the interconnects 702, 706, 710 to the output 712; a current 752 flows through the interconnects 702, 720, 704, 708, 710 to the output 712; and a current 756 flows through the interconnects 702, 730, 704, 708, 710 to the output 712. However, when the NMOS transistors are turned on and the PMOS transistors are turned off, currents 762, 766 flow through from the output 712 through the interconnects 710, 708, 704; a current 760 flows from the output 712 through the interconnects 710, 706, 702, 720, 704; and a current 764 flows from the output 712 through the interconnects 710, 706, 702, 730, 704.

As shown in FIGS. 9A, 9B, during operation of the CMOS device, current flows in opposite directions in the interconnects 706, 702 between the interconnects 720, 710; in the interconnects 706, 702 between the interconnects 730, 710; in the interconnects 708, 704 between the interconnects 720, 710; and in the interconnects 708, 704 between the interconnects 730, 710. Accordingly, by including the interconnects 720, 730, as shown in FIG. 9C, current flows in opposite directions in the interconnects 702, 704, 706, 708 during operation of the CMOS device. Because the current flows in opposite directions in the interconnects 702, 704, 706, 708 during operation of the CMOS device, EM interconnect degradation is effectively reduced because the electron wind flows in opposite directions through the interconnects.

Referring again to FIGS. 9A, 9B, the interconnects 720, 730 are parallel to the interconnect 710 and are offset from the interconnect 710 by a distance $d_t$. The distance $d_t \geq d$, where the distance d is approximately equal to a distance such that the current $i_1$ 750 is approximately equal to the current $i_5$ 760, the current $i_2$ 752 is approximately equal to the current $i_6$ 762, the current $i_3$ 754 is approximately equal to the current $i_7$ 764, and/or the current $i_4$ 756 is approximately equal to the current is 766.

Figure 10:
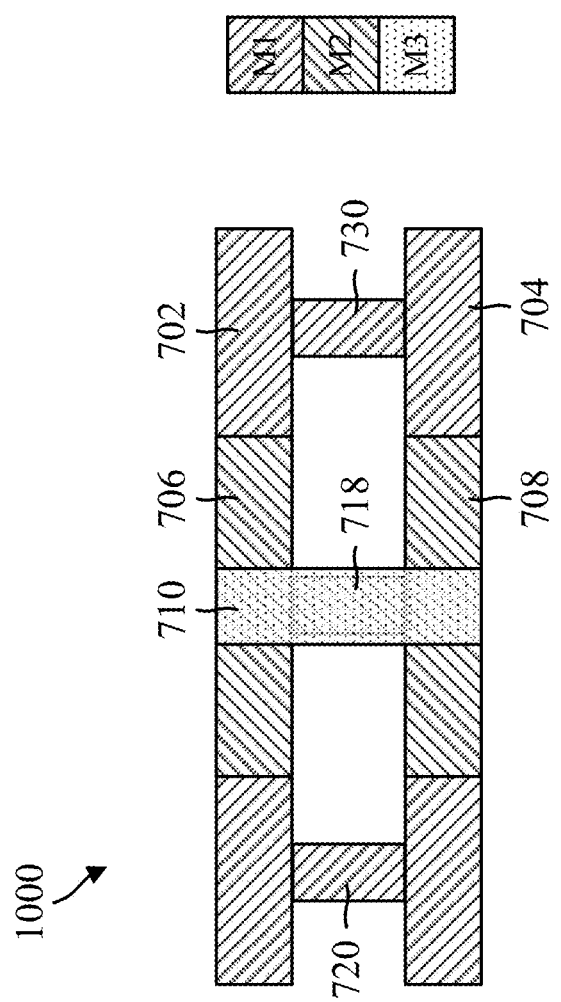
FIG. 10 is a second diagram for illustrating a second set of exemplary layouts of a CMOS device.

FIG. 10 is a second diagram 1000 for illustrating a second set of exemplary layouts of a CMOS device. Assume the interconnect 702 on a first metal layer M1 connects a plurality of PMOS drains together and the interconnect 704 on the first metal layer M1 connects a plurality of NMOS drains together. The interconnect 706 on a second metal layer M2 is connected to the interconnect 702. The interconnect 708 on the second metal layer M2 is connected to the interconnect 704. The interconnect 710 on a third metal layer M3 is connected to the interconnects 706, 708. The interconnect 720 on the first metal layer M1 connects the interconnects 702, 704 together on one side of the interconnect 710, and the interconnect 730 on the first metal layer M1 connects the interconnects 702, 704 together on the other side of the interconnect 710. As discussed supra in relation to FIG. 8, an interconnect 718 may connect the interconnects 702, 704 together beneath the interconnect 710.

Figure 11:
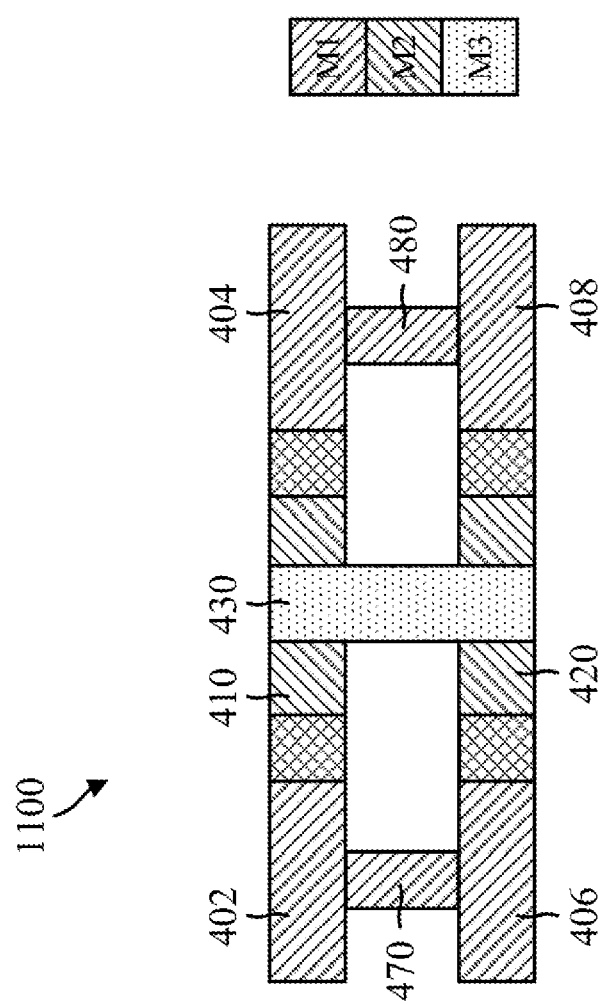
FIG. 11 is a first diagram for illustrating a third set of exemplary layouts of a CMOS device.

FIG. 11 is a first diagram 1100 for illustrating a third set of exemplary layouts of a CMOS device. The CMOS device may include a plurality of PMOS and NMOS transistors and may be an inverter. An interconnect 402 on a first metal layer M1 (i.e., a first interconnect level) may connect a first subset of the PMOS drains together. An interconnect 404 on the first metal layer M1 may connect a second subset of the PMOS drains together. The interconnect 402, 404 are disconnected on the first metal layer M1. An interconnect 406 on the first metal layer M1 may connect a first subset of the NMOS drains together. An interconnect 408 on the first metal layer M1 may connect a second subset of the NMOS drains together. The interconnects 406, 408 are disconnected on the first metal layer M1. An interconnect 410 on a second metal layer M2 (i.e., a second interconnect level) couples the interconnect 402, 404 together. An interconnect 420 on the second metal layer M2 couples the interconnects 406, 408 together. An interconnect 430 on a third metal layer M3 couples the interconnects 410, 420 together. An interconnect 470 on the first metal layer M1 couples the interconnects 402, 406 together. An interconnect 480 on the first metal layer M1 couples the interconnects 404, 408 together. As discussed in relation to FIG. 4, the interconnects 402, 404, 406, 408, 410, 420 may each be less than x μm in length. In one configuration, x=2 and the interconnects 402, 404, 406, 408, 410, 420 are each less than 2 μm in length. With the interconnects 402, 404, 406, 408, 410, 420 less than 2 μm in length, EM interconnect degradation in the interconnects 402, 404, 406, 408, 410, 420 is reduced. Further, with the interconnects 470, 480 providing parallel current paths with the interconnect 430, EM interconnect degradation is further reduced through the interconnects 402, 404, 406, 408, 410, 420 as discussed supra in relation to FIGS. 9A, 9B, 9C.

Figure 12:
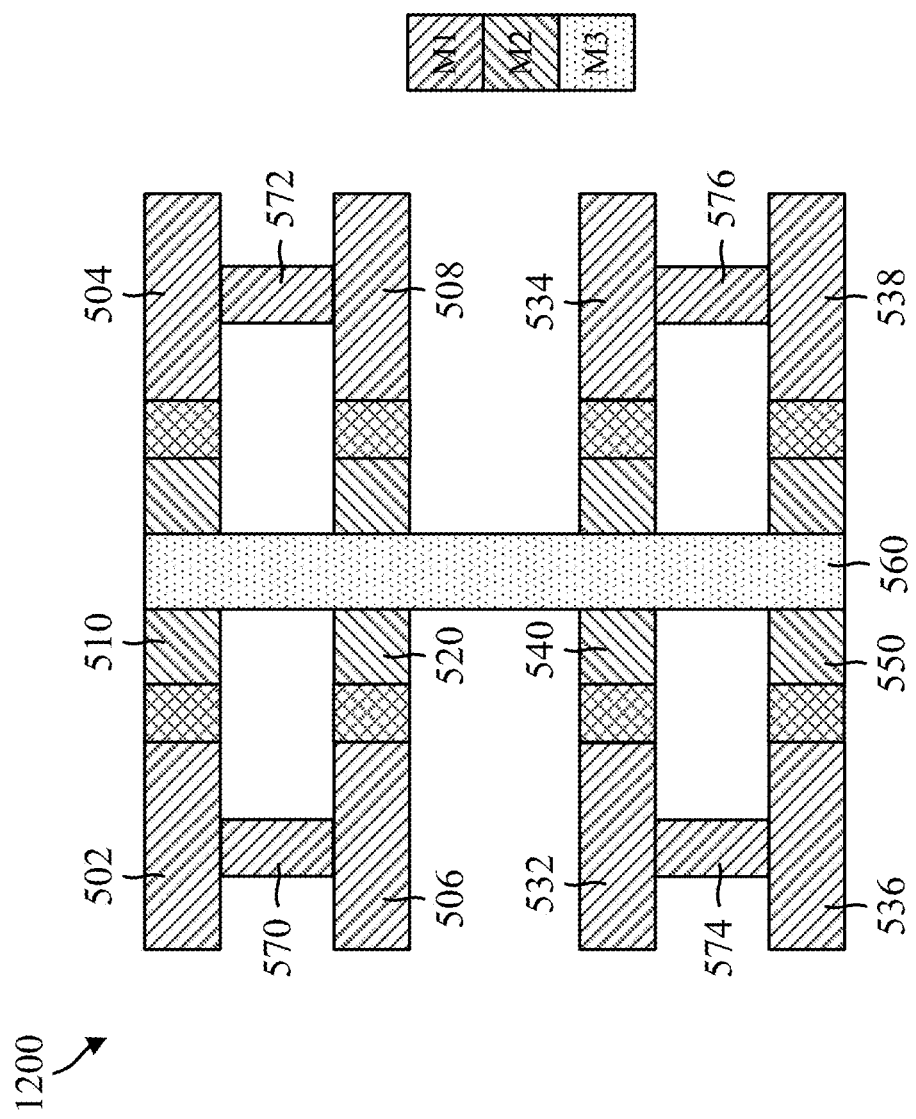
FIG. 12 is a second diagram for illustrating a third set of exemplary layouts of a CMOS device.

FIG. 12 is a second diagram 1200 for illustrating a third set of exemplary layouts of a CMOS device. The CMOS device may include a plurality of PMOS and NMOS transistors and may be an inverter. In order to increase the number of PMOS and NMOS transistors in the CMOS inverter without increasing interconnect lengths beyond a threshold (e.g., 2 µm), a CMOS inverter may utilize multiple devices of FIG. 11 in parallel. An interconnect 502 on a first metal layer M1 may connect a first subset of the PMOS drains together. An interconnect 504 on the first metal layer M1 may connect a second subset of the PMOS drains together. The interconnects 502, 504 are disconnected on the first metal layer M1. An interconnect 506 on the first metal layer M1 may connect a first subset of the NMOS drains together. An interconnect 508 on the first metal layer M1 may connect a second subset of the NMOS drains together. The interconnect 506, 508 are disconnected on the first metal layer M1. An interconnect 510 on a second metal layer M2 couples the interconnects 502, 504 together. An interconnect 520 on the second metal layer M2 couples the interconnects 506, 508 together.

An interconnect 532 on the first metal layer M1 may connect a third subset of the PMOS drains together. An interconnect 534 on the first metal layer M1 may connect a fourth subset of the PMOS drains together. The interconnects 532, 534 are disconnected on the first metal layer M1. An interconnect 536 on the first metal layer M1 may connect a third subset of the NMOS drains together. An interconnect 538 on the first metal layer M1 may connect a fourth subset of the NMOS drains together. The interconnects 536, 538 are disconnected on the first metal layer M1. An interconnect 540 on the second metal layer M2 couples the interconnects 532, 534 together. An interconnect 550 on the second metal layer M2 couples the interconnects 536, 538 together. An interconnect 560 on a third metal layer M3 couples the interconnects 510, 520, 540, 550 together.

An interconnect 570 on the first metal layer M1 couples the interconnects 502, 506 together. An interconnect 572 on the first metal layer M1 couples the interconnects 504, 508 together. An interconnect 574 on the first metal layer M1 couples the interconnects 532, 536 together. An interconnect 576 on the first metal layer M1 couples the interconnects 534, 538 together. As discussed in relation to FIG. 5, the interconnects 502, 504, 506, 508, 510, 520, 532, 534, 536, 538, 540, 550 may each be less than x µm in length. In one configuration, x=2 and the interconnects 502, 504, 506, 508, 510, 520, 532, 534, 536, 538, 540, 550 are each less than 2 µm in length. With the interconnects 502, 504, 506, 508, 510, 520, 532, 534, 536, 538, 540, 550 less than 2 µm in length, EM interconnect degradation in the interconnects 502, 504, 506, 508, 510, 520, 532, 534, 536, 538, 540, 550 is reduced. Further, with the interconnects 570, 572, 574, 576 providing parallel current paths with the interconnect 560, EM interconnect degradation is further reduced through the interconnects 502, 504, 506, 508, 510, 520, 532, 534, 536, 538, 540, 550 as discussed supra in relation to FIGS. 9A, 9B, 9C.

Figure 13:
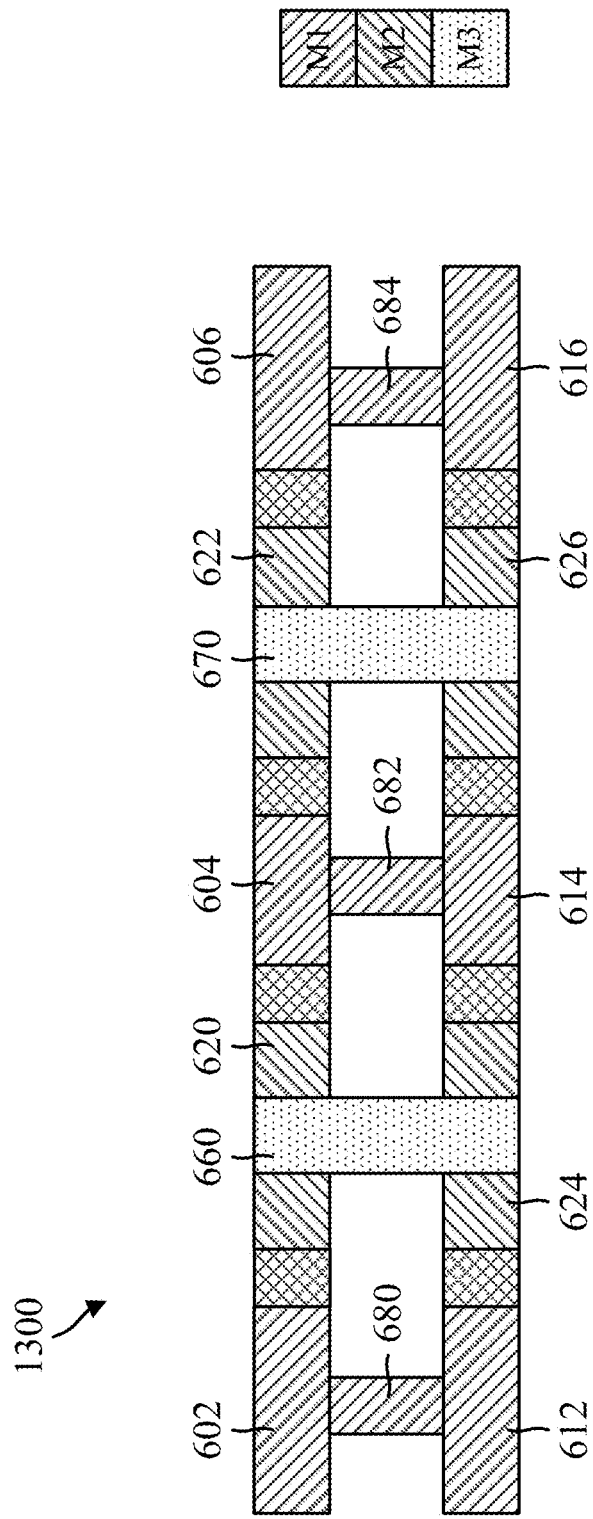
FIG. 13 is a third diagram for illustrating a third set of exemplary layouts of a CMOS device.

FIG. 13 is a third diagram 1300 for illustrating a third set of exemplary layouts of a CMOS device. The CMOS device may include a plurality of PMOS and NMOS transistors and may be an inverter. In order to increase the number of PMOS and NMOS transistors in the CMOS inverter without increasing interconnect lengths beyond a threshold (e.g., 2 µm), a CMOS inverter may utilize multiple devices of FIG. 11 in series. An interconnect 602 on a first metal layer M1 may connect a first subset of the PMOS drains together. An interconnect 604 on the first metal layer M1 may connect a second subset of the PMOS drains together. The interconnects 602, 604 are disconnected on the first metal layer M1. An interconnect 612 on the first metal layer M1 may connect a first subset of the NMOS drains together. An interconnect 614 on the first metal layer M1 may connect a second subset of the NMOS drains together. The interconnects 612, 614 are disconnected on the first metal layer M1.

An interconnect 606 on a first metal layer M1 may connect a third subset of the PMOS drains together. The interconnects 606, 604 are disconnected on the first metal layer M1. An interconnect 616 on the first metal layer M1 may connect a third subset of the NMOS drains together. The interconnects 616, 614 are disconnected on the first metal layer M1. As shown in FIG. 13, a first set of interconnects 602, 604, 606 on the first metal layer M1 may connect different subsets of the PMOS drains together. Each interconnect in the first set of interconnects 602, 604, 606 is disconnected from other interconnects in the first set of interconnects 602, 604, 606 on the first metal layer M1. A second set of interconnects 612, 614, 616 on the first metal layer M1 connect different subsets of the NMOS drains together. Each interconnect in the second set of interconnects 612, 614, 616 is disconnected from other interconnects in the second set of interconnects 612, 614, 616 on the first metal layer M1. A third set of interconnects 620, 622 on the second metal layer M2 couple different adjacent pairs of interconnects in the first set of interconnects 602, 604, 606 together. A fourth set of interconnects 624, 626 on the second metal layer M2 couple different adjacent pairs of interconnects in the second set of interconnects 612, 614, 616 together. A fifth set of interconnects 660, 670 on the third metal layer M3 couple different adjacent pairs of interconnects including interconnects from the third set of interconnects 620, 622 and interconnects from the fourth set of interconnects 624, 626. Each interconnect in the fifth set of interconnects 660, 670 is coupled together.

An interconnect 680 couples the interconnects 602, 612 together, an interconnect 682 couples the interconnects 604, 614 together, and an interconnect 684 couples the interconnects 606, 616 together. Each interconnect 602, 604, 606, 612, 614, 616, 620, 622, 624, 626 in the first, second, third, and fourth sets of interconnects may be less than x µm in length. In one configuration, x=2. With the interconnects 602, 604, 606, 612, 614, 616, 620, 622, 624, 626 less than 2 µm in length, EM interconnect degradation in those interconnects is reduced. Further, with the interconnects 680, 682, 684 providing parallel current paths with the interconnects 660, 670, EM interconnect degradation is further reduced through the interconnects 602, 604, 606, 612, 614, 616, 620, 622, 624, 626 as discussed supra in relation to FIGS. 9A, 9B, 9C.

Figure 14:
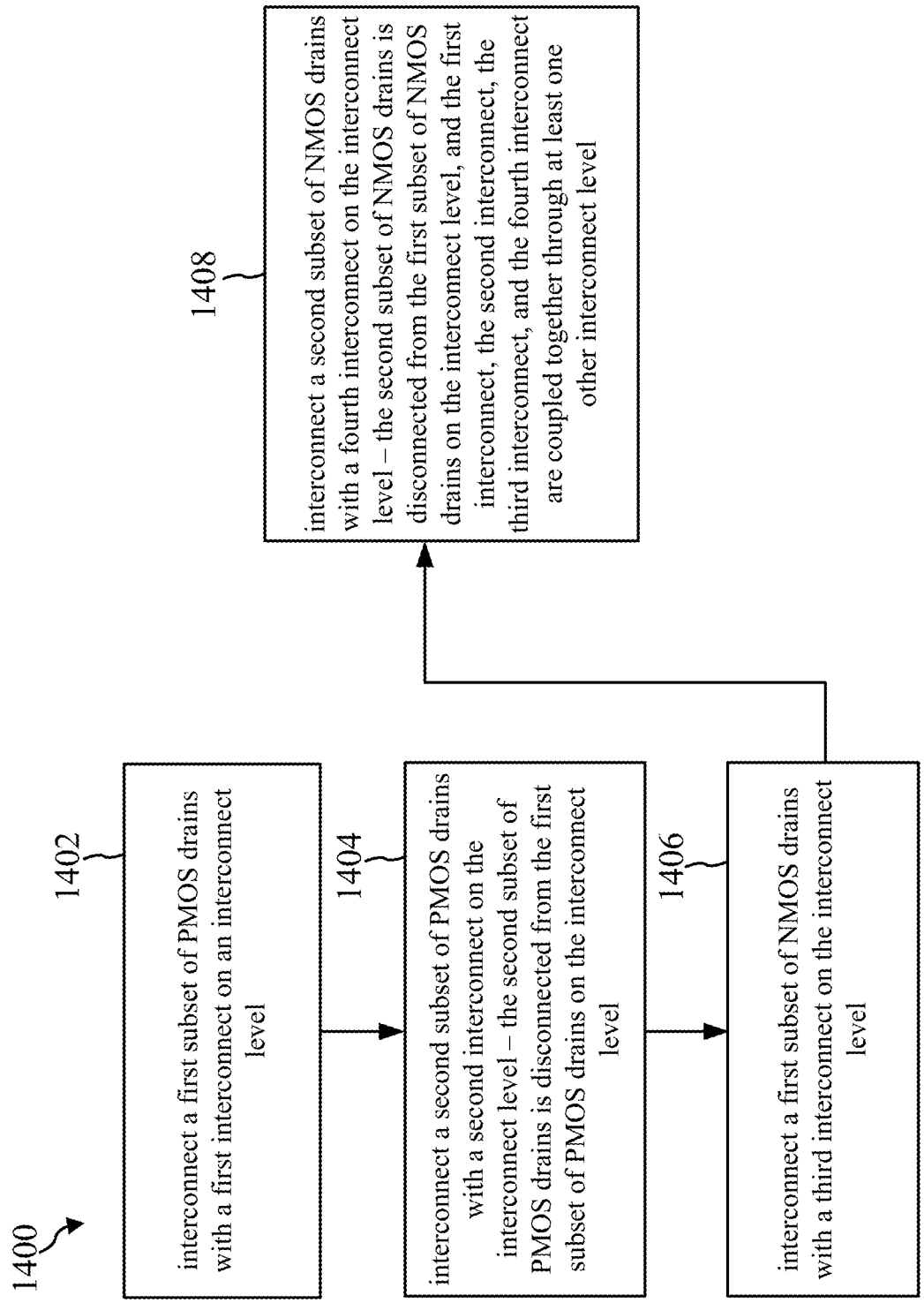
FIG. 14 is a flow chart of a first method of laying out a CMOS device.

FIG. 14 is a flow chart 1400 of a first method of laying out a CMOS device. The CMOS device includes a plurality of PMOS transistors each having a PMOS drain and a plurality of NMOS transistors each having an NMOS drain. In step 1402, a first subset of PMOS drains is interconnected with a first interconnect on an interconnect level. In step 1404, a second subset of PMOS drains is interconnected with a second interconnect on the interconnect level. The second subset of PMOS drains is disconnected from the first subset of PMOS drains on the interconnect level. In step 1406, a first subset of NMOS drains is interconnected with a third interconnect on the interconnect level. In step 1408, a second subset of NMOS drains is interconnected with a fourth interconnect on the interconnect level. The second subset of NMOS drains is disconnected from the first subset of NMOS drains on the interconnect level. The first interconnect, the second interconnect, the third interconnect, and the fourth interconnect are coupled together through at least one other interconnect level.

For example, referring to FIG. 4, a first subset of PMOS drains is interconnected with a first interconnect 402 on a first metal layer M1. A second subset of PMOS drains is interconnected with a second interconnect 404 on the first metal layer M1. The second subset of PMOS drains is disconnected from the first subset of PMOS drains on the first metal layer M1, as the interconnects 402, 404 are disconnected on the first metal layer M1. A first subset of NMOS drains is interconnected with a third interconnect 406 on the first metal layer M1. A second subset of NMOS drains is interconnected with a fourth interconnect 408 on the first metal layer M1. The second subset of NMOS drains is disconnected from the first subset of NMOS drains on the first metal layer M1, as the interconnects 406, 408 are disconnected on the first metal layer M1. The first interconnect 402, the second interconnect 404, the third interconnect 406, and the fourth interconnect 408 are coupled together through at least one other metal layers, such as a second metal layer M2 and a third metal layer M3.

As shown in FIG. 4, the first interconnect 402, the second interconnect 404, the third interconnect 406, and the fourth interconnect 408 may each less than 2 µm in length. The first interconnect 402 and the second interconnect 404 may be interconnected with a fifth interconnect 410 on a second interconnect level (e.g., the second metal layer M2). The third interconnect 406 and the fourth interconnect 408 may be interconnected with a sixth interconnect 420 on the second interconnect level. The fifth interconnect 410 and the sixth interconnect 420 may each be less than 2 µm in length. The fifth interconnect 410 and the sixth interconnect 420 may be interconnected with a seventh interconnect 430 on a third interconnect level (e.g., a third metal layer M3). An output of the device may be connected to the seventh interconnect 430. The CMOS device may be an inverter. The PMOS transistors may each have a PMOS gate and a PMOS source. The NMOS transistors may each have an NMOS gate and an NMOS source. The NMOS sources of the NMOS transistors may be coupled together. The PMOS sources of the PMOS transistors may be together. The PMOS gates of the PMOS transistors and the NMOS gates of the NMOS transistors may be coupled together.

Figure 15:
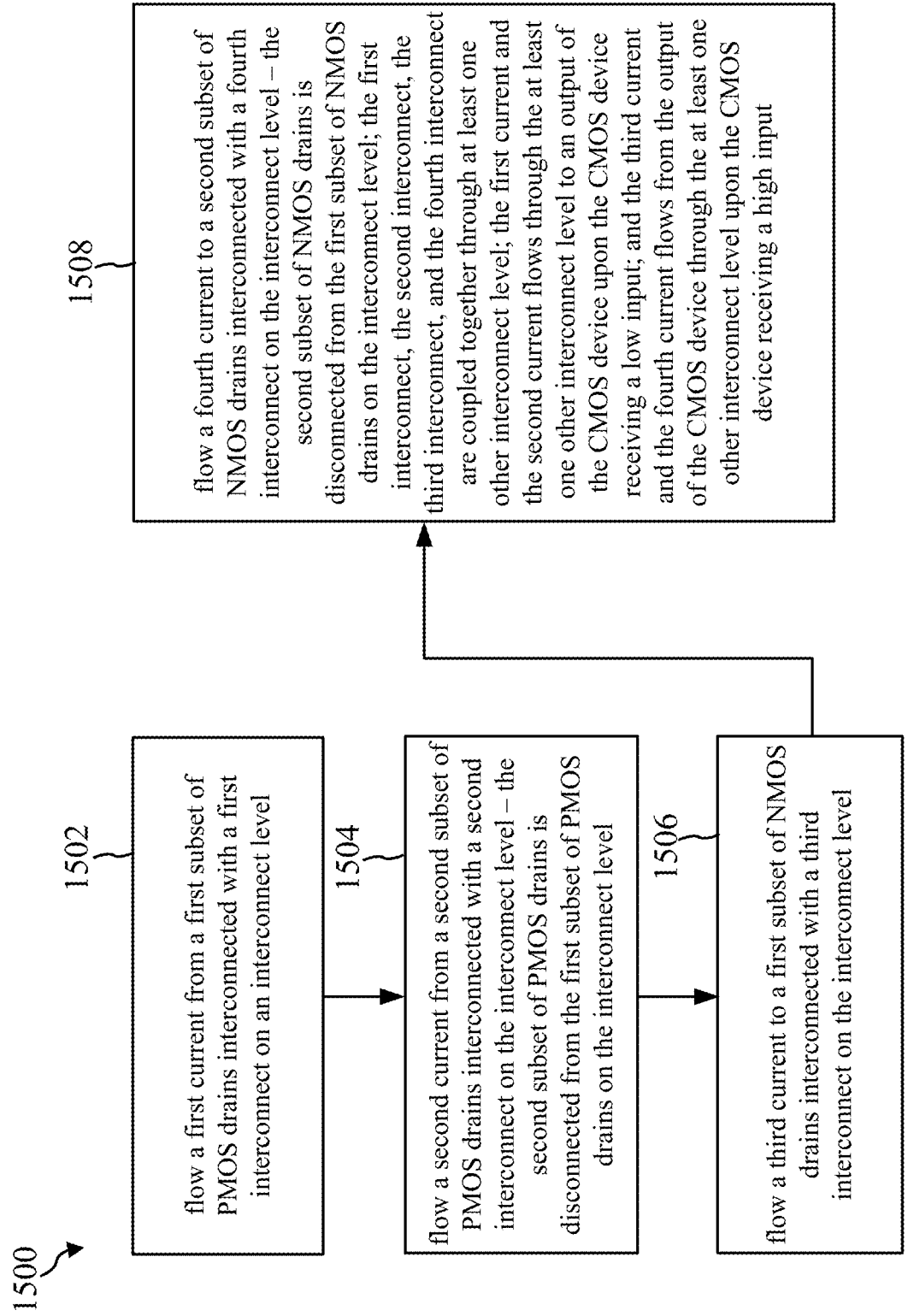
FIG. 15 is a flow chart of a first method of operating a CMOS device.

FIG. 15 is a flow chart 1500 of a first method of operating a CMOS device. The CMOS device includes a plurality of PMOS transistors each having a PMOS drain and a plurality of NMOS transistors each having an NMOS drain. In step 1502, a first current flows from a first subset of PMOS drains interconnected with a first interconnect on an interconnect level. In step 1504, a second current flows from a second subset of PMOS drains interconnected with a second interconnect on the interconnect level. The second subset of PMOS drains is disconnected from the first subset of PMOS drains on the interconnect level. In step 1506, a third current flows to a first subset of NMOS drains interconnected with a third interconnect on the interconnect level. In step 1508, a fourth current flows to a second subset of NMOS drains interconnected with a fourth interconnect on the interconnect level. The second subset of NMOS drains is disconnected from the first subset of NMOS drains on the interconnect level. The first interconnect, the second interconnect, the third interconnect, and the fourth interconnect are coupled together through at least one other interconnect level. The first current and the second current flows through the at least one other interconnect level to an output of the CMOS device upon the CMOS device receiving a low input. The third current and the fourth current flows from the output of the CMOS device through the at least one other interconnect level upon the CMOS device receiving a high input.

For example, referring to FIG. 4, a first current flows from a first subset of PMOS drains interconnected with a first interconnect 402 on a first metal layer M1. A second current flows from a second subset of PMOS drains interconnected with a second interconnect 404 on the first metal layer M1. The second subset of PMOS drains is disconnected from the first subset of PMOS drains on the first metal layer M1, as the interconnects 402, 404 are disconnected on the first metal layer M1. A third current flows to a first subset of NMOS drains interconnected with a third interconnect 406 on the first metal layer M1. A fourth current flows to a second subset of NMOS drains interconnected with a fourth interconnect 408 on the first metal layer M1. The second subset of NMOS drains is disconnected from the first subset of NMOS drains on the first metal layer M1, as the interconnects 406, 408 are disconnected on the first metal layer M1. The first interconnect 402, the second interconnect 404, the third interconnect 406, and the fourth interconnect 408 are coupled together through at least one other interconnect level, such as a second metal layer M2 and a third metal layer M3. The first current and the second current flows through the at least one other interconnect level to an output of the CMOS device upon the CMOS device receiving a low input. The third current and the fourth current flows from the output of the CMOS device through the at least one other interconnect level upon the CMOS device receiving a high input.

The first interconnect 402, the second interconnect 404, the third interconnect 406, and the fourth interconnect 408 may each be less than 2 µm in length. The first interconnect 402 and the second interconnect 404 may be interconnected with a fifth interconnect 410 on a second interconnect level (e.g., the second metal layer M2), and the third interconnect 406 and the fourth interconnect 408 may be interconnected with a sixth interconnect 420 on the second interconnect level. The fifth interconnect 410 and the sixth interconnect 420 may each be less than 2 µm in length. The fifth interconnect 410 and the sixth interconnect 420 may be interconnected with a seventh interconnect 430 on a third interconnect level (e.g., a third metal layer M3). An output of the device may be connected to the seventh interconnect 430. The CMOS device may be an inverter. The PMOS transistors may each have a PMOS gate and a PMOS source. The NMOS transistors may each have an NMOS gate and an NMOS source. The NMOS sources of the NMOS transistors may be coupled together. The PMOS sources of the PMOS transistors may be coupled together. The PMOS gates of the PMOS transistors and the NMOS gates of the NMOS transistors may be coupled together.

Figure 16:
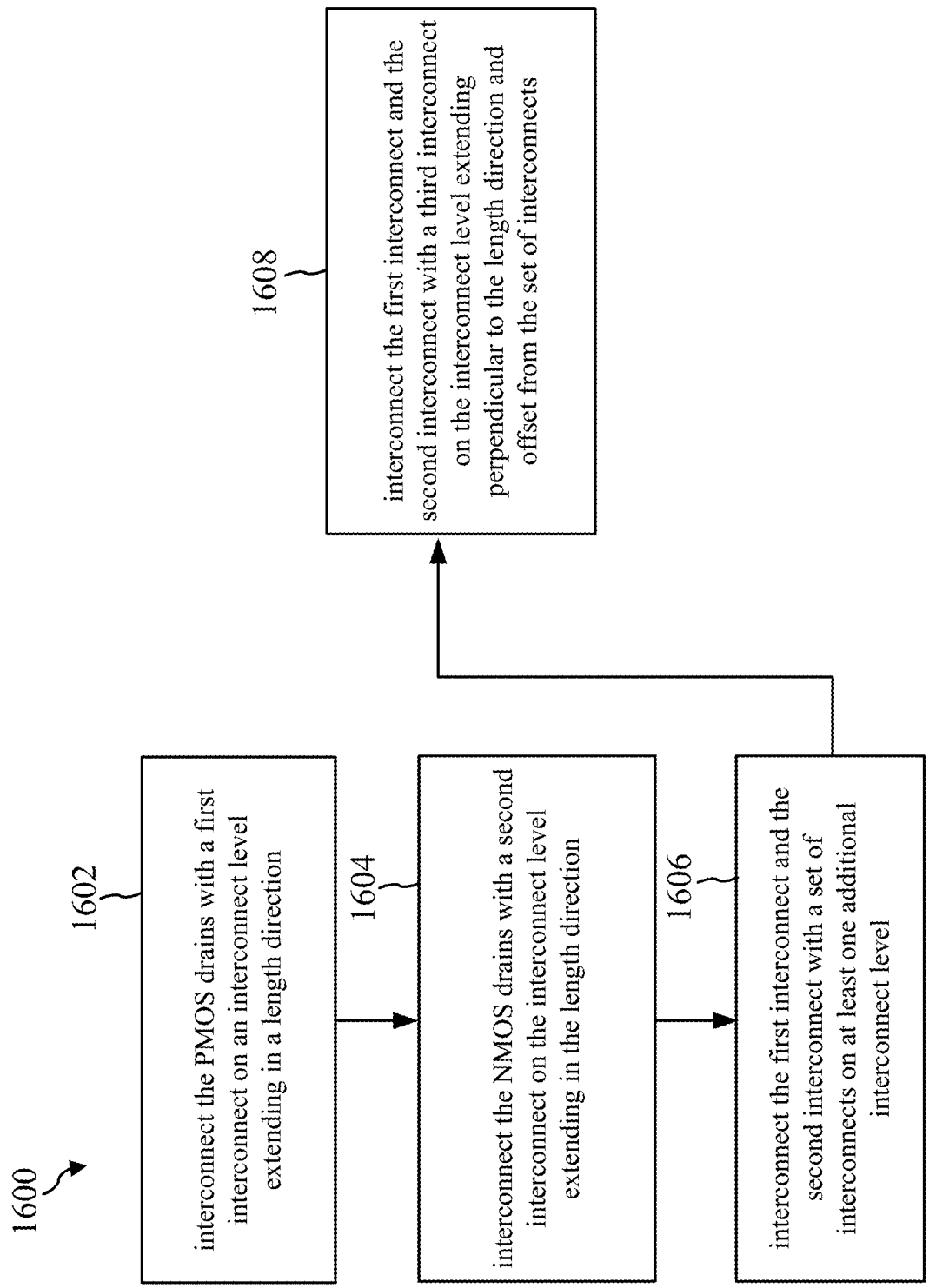
FIG. 16 is a flow chart of a second method of laying out a CMOS device.

FIG. 16 is a flow chart 1600 of a second method of laying out a CMOS device. The CMOS device includes a plurality of PMOS transistors each having a PMOS drain and a plurality of NMOS transistors each having an NMOS drain. In step 1602, the PMOS drains are interconnected with a first interconnect on an interconnect level extending in a length direction. In step 1604, the NMOS drains are interconnected with a second interconnect on the interconnect level extending in the length direction. In step 1606, the first interconnect and the second interconnect are interconnected with a set of interconnects on at least one additional interconnect level. In step 1608, the first interconnect and the second interconnect are interconnected with a third interconnect on the interconnect level extending perpendicular to the length direction and offset from the set of interconnects.

For example, referring to FIGS. 9A, 9B, the PMOS drains are interconnected with a first interconnect 702 on a first metal layer M1 extending in a length direction. The NMOS drains are interconnected with a second interconnect 704 on the first metal layer M1 extending in the length direction. The first interconnect 702 and the second interconnect 704 are interconnected with a set of interconnects 706, 708, 710 on at least one additional interconnect level, such as a second metal layer M2 and a third metal layer M3. The first interconnect 702 and the second interconnect 704 are interconnected with a third interconnect 720 on the first metal layer M1 extending perpendicular to the length direction and offset from the set of interconnects 706, 708, 710.

The first interconnect 702 and the second interconnect 704 may be interconnected with a fourth interconnect 730 on the interconnect level (e.g., the first metal layer M1) extending perpendicular to the length direction and offset from the set of interconnects 706, 708, 710. The third interconnect 720 and the fourth interconnect 730 may be on opposite sides of the set of interconnects 706, 708, 710. The at least one additional interconnect level (e.g., a second metal layer M2 and a third metal layer M3) may include a second interconnect level (e.g., the second metal layer M2) and a third interconnect level (e.g., the third metal layer M3), and the set of interconnects 706, 708, 710 may include a fifth interconnect 706 on the second interconnect level coupled to the first interconnect 702, a sixth interconnect 708 on the second interconnect level coupled to the second interconnect 704, and a seventh interconnect 710 on the third interconnect level coupling the fifth interconnect 706 and the sixth interconnect 708 together. The seventh interconnect 710 may be an output of the device. The third interconnect 720 and the fourth interconnect 730 may be parallel to the seventh interconnect 710 and may be offset by at least a distance d from the seventh interconnect 710. The distance d may be approximately equal to a distance such that a current $i_1$ flowing in the first interconnect 702 between the third interconnect 720 and the seventh interconnect 710 upon turning the PMOS transistors on and the NMOS transistors off is approximately equal to a current $i_5$ flowing in the first interconnect 702 between the seventh interconnect 710 and the third interconnect 720 upon turning the PMOS transistors off and the NMOS transistors on. The distance d may be approximately equal to a distance such that a current $i_3$ flowing in the first interconnect 702 between the fourth interconnect 730 and the seventh interconnect 710 upon turning the PMOS transistors on and the NMOS transistors off is approximately equal to a current $i_7$ flowing in the first interconnect 702 between the seventh interconnect 710 and the fourth interconnect 730 upon turning the PMOS transistors off and the NMOS transistors on. The distance d may be approximately equal to a distance such that a current $i_2$ flowing in the second interconnect 704 between the third interconnect 720 and the seventh interconnect 710 upon turning the PMOS transistors on and the NMOS transistors off is approximately equal to a current $i_6$ flowing in the second interconnect 704 between the seventh interconnect 710 and the third interconnect 720 upon turning the PMOS transistors off and the NMOS transistors on. The distance d may be approximately equal to a distance such that a current $i_4$ flowing in the second interconnect 704 between the fourth interconnect 730 and the seventh interconnect 710 upon turning the PMOS transistors on and the NMOS transistors off is approximately equal to a current is flowing in the second interconnect 704 between the seventh interconnect 710 and the fourth interconnect 730 upon turning the PMOS transistors off and the NMOS transistors on. The CMOS device may be an inverter. The PMOS transistors may each have a PMOS gate and a PMOS source. The NMOS transistors may each have an NMOS gate and an NMOS source. The NMOS sources of the NMOS transistors may be coupled together. The PMOS sources of the PMOS transistors may be coupled together. The PMOS gates of the PMOS transistors and the NMOS gates of the NMOS transistors may be coupled together.

Figure 17:
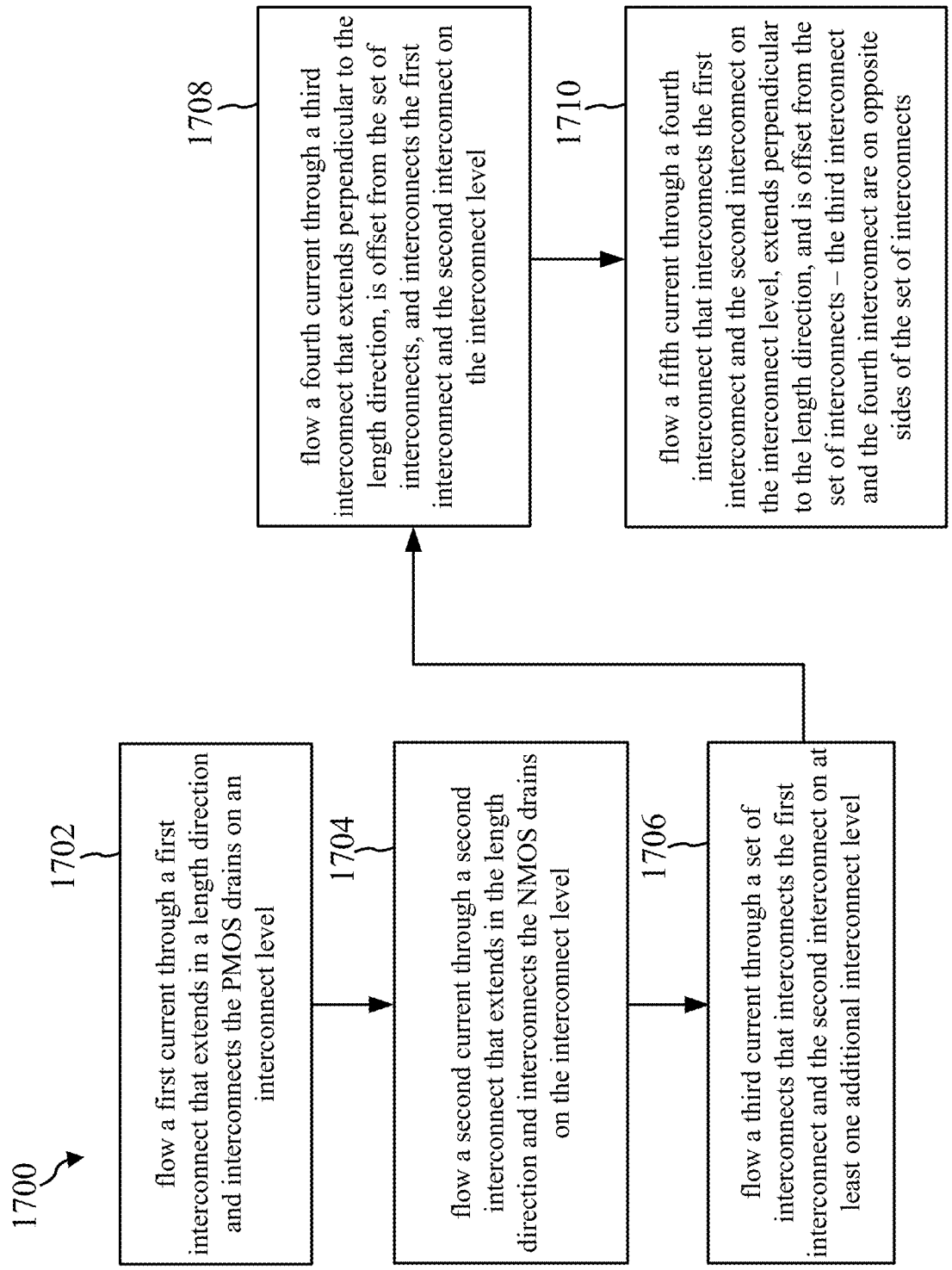
FIG. 17 is a flow chart of a second method of operating a CMOS device.

FIG. 17 is a flow chart 1700 of a second method of operating a CMOS device. The CMOS device includes a plurality of PMOS transistors each having a PMOS drain and a plurality of NMOS transistors each having an NMOS drain. In step 1702, a first current flows through a first interconnect that extends in a length direction and interconnects the PMOS drains on an interconnect level. In step 1704, a second current flows through a second interconnect that extends in the length direction and interconnects the NMOS drains on the interconnect level. In step 1706, a third current flows through a set of interconnects that interconnects the first interconnect and the second interconnect on at least one additional interconnect level. In step 1708, a fourth current flows through a third interconnect that extends perpendicular to the length direction, is offset from the set of interconnects, and interconnects the first interconnect and the second interconnect on the interconnect level. In step 1710, a fifth current flows through a fourth interconnect that interconnects the first interconnect and the second interconnect on the interconnect level, extends perpendicular to the length direction, and is offset from the set of interconnects. The third interconnect and the fourth interconnect are on opposite sides of the set of interconnects.

For example, referring to FIGS. 9A, 9B, a first current $i_1+i_3$ or $i_5+i_7$ flows through a first interconnect 702 that extends in a length direction and interconnects the PMOS drains on a first metal layer M1. A second current $i_2+i_4$ or $i_6+i_8$ flows through a second interconnect 704 that extends in the length direction and interconnects the NMOS drains on the first metal layer M1. A third current $i_1+i_2+i_3+i_4$ or $i_5+i_6+i_7+i_8$ flows through a set of interconnects 706, 708, 710 that interconnects the first interconnect 702 and the second interconnect 704 on a second metal layer M2 and a third metal layer M3. A fourth current $i_2$ or $i_5$ flows through a third interconnect 720 that extends perpendicular to the length direction, is offset from the set of interconnects 706, 708, 710, and interconnects the first interconnect 702 and the second interconnect 704 on the first metal layer M1. A fifth current $i_4$ or $i_8$ flows through a fourth interconnect 730 that interconnects the first interconnect 702 and the second interconnect 704 on the first metal layer M1, extends perpendicular to the length direction, and is offset from the set of interconnects 706, 708, 710. The third interconnect 720 and the fourth interconnect 730 are on opposite sides of the set of interconnects 706, 708, 710.

Upon the CMOS device receiving a low input, the first current $i_1+i_3$ flows through the first interconnect 702 to a first subset 706, 710 of the set of interconnects 706, 708, 710, the second current $i_2+i_4$ flows from the third interconnect 720 and the fourth interconnect 730 through the second interconnect 704 to a second subset 708, 710 of the set of interconnects 706, 708, 710, the third current $i_1+i_2+i_3+i_4$ flows from the first interconnect 702 and the second interconnect 704 through the set of interconnects 706, 708, 710, the fourth current $i_2$ flows from the first interconnect 702 through the third interconnect 720 to the second interconnect 704, and the fifth current $i_4$ flows from the first interconnect 702 through the fourth interconnect 730 to the second interconnect 704. Upon the CMOS device receiving a high input, the first current $i_5+i_7$ flows from the first subset 706, 710 of the set of interconnects 706, 708, 710 through the first interconnect 702 to the third interconnect 720 and the fourth interconnect 730, the second current $i_6+i_8$ flows from the second subset 708, 710 of the set of interconnects 706, 708, 710 through the second interconnect 704, the third current $i_5+i_6+i_7+i_8$ flows from the set of interconnects 706, 708, 710 to the first interconnect 702 and the second interconnect 704, the fourth current is flows from the first interconnect 702 through the third interconnect 720 to the second interconnect 704, and the fifth current is flows from the first interconnect 702 through the fourth interconnect 730 to the second interconnect 704.

The at least one additional interconnect level may include a second interconnect level (e.g., a second metal layer M2) and a third interconnect level (e.g., a third metal layer M3), and the set of interconnects 706, 708, 710 may include a fifth interconnect 706 on the second interconnect level coupled to the first interconnect 702, a sixth interconnect 708 on the second interconnect level coupled to the second interconnect 704, and a seventh interconnect 710 on the third interconnect level coupling the fifth interconnect 706 and the sixth interconnect 708 together. The seventh interconnect 710 may be an output of the device.

In one configuration, a CMOS device includes a plurality of PMOS transistors each having a PMOS drain and a plurality of NMOS transistors each having an NMOS drain. The device includes means for interconnecting a first subset of PMOS drains with a first interconnect (e.g., the interconnect 402) on an interconnect level (e.g., a first metal layer M1). The device further includes means for interconnecting a second subset of PMOS drains with a second interconnect (e.g., the interconnect 404) on the interconnect level. The second subset of PMOS drains is disconnected from the first subset of PMOS drains on the interconnect level. The device further includes means for interconnecting a first subset of NMOS drains with a third interconnect (e.g., the interconnect 406) on the interconnect level. The device further includes means for interconnecting a second subset of NMOS drains with a fourth interconnect (e.g., the interconnect 408) on the interconnect level. The second subset of NMOS drains is disconnected from the first subset of NMOS drains on the interconnect level. The first interconnect, the second interconnect, the third interconnect, and the fourth interconnect are coupled together through at least one other interconnect level. The device may further include means for interconnecting the first interconnect and the second interconnect with a fifth interconnect (e.g., the interconnect 410) on a second interconnect level (e.g., a second metal layer M2), and means for interconnecting the third interconnect and the fourth interconnect with a sixth interconnect (e.g., the interconnect 420) on the second interconnect level. The device may further include means for interconnecting the fifth interconnect and the sixth interconnect with a seventh interconnect (e.g., the interconnect 430) on a third interconnect level (e.g., a third metal layer M3). The CMOS device may be an inverter, the PMOS transistors may each have a PMOS gate and a PMOS source, and the NMOS transistors may each have an NMOS gate and an NMOS source. The device may further include means for coupling the NMOS sources of the NMOS transistors together, means for coupling the PMOS sources of the PMOS transistors together, and means for coupling the PMOS gates of the PMOS transistors and the NMOS gates of the NMOS transistors together (e.g., see FIG. 2).

In one configuration, a CMOS device includes a plurality of PMOS transistors each having a PMOS drain and a plurality of NMOS transistors each having an NMOS drain. The device includes means for interconnecting the PMOS drains with a first interconnect (e.g., the interconnect 702) on an interconnect level (e.g., a first metal layer M1) extending in a length direction. The device further includes means for interconnecting the NMOS drains with a second interconnect (e.g., the interconnect 704) on the interconnect level extending in the length direction. The device further includes means for interconnecting the first interconnect and the second interconnect with a set of interconnects (e.g., the interconnects 706, 708, 710) on at least one additional interconnect level (e.g., a second metal layer M2 and a third metal layer M3). The device further includes means for interconnecting the first interconnect and the second interconnect with a third interconnect (e.g., the interconnect 720) on the interconnect level extending perpendicular to the length direction and offset from the set of interconnects. The device may further include means for interconnecting the first interconnect and the second interconnect with a fourth interconnect (e.g., the interconnect 730) on the interconnect level extending perpendicular to the length direction and offset from the set of interconnects. The third interconnect and the fourth interconnect are on opposite sides of the set of interconnects.

Methods of laying out CMOS devices for addressing EM and CMOS devices with layout constructions for addressing EM are provided supra. The exemplary methods and CMOS devices reduce EM in a set of interconnects by limiting lengths (increasing a mechanical stress buildup/back stress) of the set of interconnects and/or providing additional current paths that result in bidirectional current flow (a bidirectional electron wind) through the set of interconnects.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C.

Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A complementary metal oxide semiconductor (CMOS) device including a plurality of p-type metal oxide semiconductor (PMOS) transistors each having a PMOS drain and a PMOS gate and a plurality of n-type metal oxide semiconductor (NMOS) transistors each having an NMOS drain and an NMOS gate, each PMOS gate and NMOS gate extending in a first direction, the CMOS device comprising:
    a first interconnect on an interconnect level connecting a first plurality of the PMOS drains together, a second interconnect on the interconnect level connecting a second plurality of the PMOS drains together, the second plurality of the PMOS drains being different than the first plurality of the PMOS drains,
    a third interconnect on the interconnect level connecting a first plurality of the NMOS drains together, a fourth interconnect on the interconnect level connecting a second plurality of the NMOS drains together, the second plurality of the NMOS drains being different than the first plurality of the NMOS drains,
    wherein the first interconnect, the second interconnect, the third interconnect, and fourth interconnect are disconnected on the interconnect level,
    wherein the first, second, third, and fourth interconnects extend in a second direction, and
    wherein the first, second, third, and fourth interconnects are coupled together through at least one other interconnect level.

2. The device of claim 1, further comprising:
    a fifth interconnect on a second interconnect level, the fifth interconnect coupling the first interconnect and the second interconnect together; and
    a sixth interconnect on the second interconnect level, the sixth interconnect coupling the third interconnect and the fourth interconnect together.

3. The device of claim 2, further comprising a seventh interconnect on a third interconnect level, the seventh interconnect coupling the fifth interconnect and the sixth interconnect together.

4. The device of claim 1, wherein a length of the first interconnect and a length of the second interconnect are equal.

5. The device of claim 2, further comprising an eighth interconnect connecting sources of the plurality of PMOS transistors, wherein a length of the first interconnect is less than a length of the eighth interconnect and a length of the second interconnect is less than the length of the eighth interconnect.

6. The device of claim 5, wherein the first interconnect and the second interconnect are each equal or less than 2 µm in length.

7. The device of claim 1, wherein a length of the third interconnect and a length of the fourth interconnect are equal.

8. The device of claim 5, further comprising a ninth interconnect connecting sources of the plurality of NMOS transistors, wherein a length of the third interconnect is less than a length of the ninth interconnect and a length of the fourth interconnect is less than the length of the ninth interconnect.

9. The device of claim 8, wherein the third interconnect and the fourth interconnect are each equal or less than 2 µm in length.

10. The device of claim 2, wherein the fifth interconnect and the sixth interconnect are disconnected on the second interconnect level.

11. The device of claim 10, wherein a length of the fifth interconnect is less than the length of the eighth interconnect and wherein a length of the sixth interconnect is less than the length of the ninth interconnect.

12. The device of claim 10, further comprising a seventh interconnect on a third interconnect level, the seventh interconnect coupling the fifth interconnect and the sixth interconnect together.

13. The device of claim 11, wherein the fifth interconnect and the sixth interconnect are each less than 2 µm in length.

14. The device of claim 3, wherein the seventh interconnect extends in the first direction.

15. The device of claim 1, wherein the first interconnect, the second interconnect, the third interconnect, and the fourth interconnect are on a first metal layer (M1).

16. The device of claim 2, wherein the fifth interconnect and the sixth interconnect are on a second metal layer (M2).

17. The device of claim 3, wherein the seventh interconnect is on a third metal layer (M3).

18. The device of claim 3, wherein the first interconnect, the second interconnect, the third interconnect, and the fourth interconnect are on a first metal layer above a substrate, the fifth interconnect and the sixth interconnect are on a second metal layer above the first metal layer, and the seventh interconnect is on a third metal layer above the second metal layer.

19. The device of claim 1, wherein the first direction is substantially perpendicular to the second direction.

20. The device of claim 10, wherein lengths of the fifth interconnect and the sixth interconnect are substantially similar.

* * * * *